US012584214B2

(12) United States Patent
Pegna et al.

(10) Patent No.: US 12,584,214 B2
(45) Date of Patent: Mar. 24, 2026

(54) EMBEDDED WIRE CHEMICAL VAPOR DEPOSITION (EWCVD)

(71) Applicant: FREE FORM FIBERS, LLC, Saratoga Springs, NY (US)

(72) Inventors: Joseph Pegna, Saratoga Springs, NY (US); Kirk L Williams, Saratoga Springs, NY (US); Shay L Harrison, East Schodack, NY (US)

(73) Assignee: Free Form Fibers, LLC, Saratoga Springs, NY (US)

( * ) Notice: Subject to any disclaimer, the term of this patent is extended or adjusted under 35 U.S.C. 154(b) by 951 days.

(21) Appl. No.: 17/661,059

(22) Filed: Apr. 28, 2022

(65) Prior Publication Data

US 2022/0411921 A1 Dec. 29, 2022

Related U.S. Application Data

(60) Provisional application No. 63/267,118, filed on Jan. 25, 2022, provisional application No. 63/216,092, filed on Jun. 29, 2021.

(51) Int. Cl.
| | |
|---|---|
| *C23C 16/44* | (2006.01) |
| *C04B 35/80* | (2006.01) |
| *H05B 3/34* | (2006.01) |

(52) U.S. Cl.
CPC .............. *C23C 16/44* (2013.01); *H05B 3/34* (2013.01)

(58) Field of Classification Search
CPC ... C23C 16/4488; C23C 16/045; C23C 16/26; C23C 16/44; H05B 3/48; H05B 3/34;
(Continued)

(56) References Cited

U.S. PATENT DOCUMENTS

| | | | |
|---|---|---|---|
| 3,062,683 A | 11/1962 | Kalleberg et al. | |
| 3,103,476 A | 9/1963 | Mumm | |

(Continued)

FOREIGN PATENT DOCUMENTS

| | | |
|---|---|---|
| CN | 103387230 A | 11/2013 |
| EP | 1 209 123 A2 | 5/2002 |

(Continued)

OTHER PUBLICATIONS

Ares, et al. "Columnar-to-Equiaxed Transition in Metal-Matrix Composites Reinforced with Silicon Carbide Particles", Hindawi Publishing Corporation, Journal of Metallurgy, vol. 2013, Article ID 628495, 12 pages.
(Continued)

*Primary Examiner* — Eric S Stapleton

(74) *Attorney, Agent, or Firm* — Kevin P. Radigan, Esq.; Heslin Rothenberg Farley & Mesiti P.C.

(57) ABSTRACT

Methods of forming a ceramic matrix, as well as fiber preforms and methods of forming fiber preforms to facilitate formation of a ceramic matrix are provided. The method includes obtaining a fiber preform to facilitate forming the ceramic matrix. The fiber preform includes a fiber layer with a plurality of fibers and a heating element embedded within the fiber preform. The method also includes heating the fiber preform via the heating element embedded within the fiber preform, and depositing matrix material into the fiber preform by embedded wire chemical vapor deposition (EWCVD) of the matrix material during the heating of the fiber preform by the heating element. The chemical vapor deposition of the matrix material within the fiber preform facilitates formation of the ceramic matrix.

18 Claims, 25 Drawing Sheets

500

(58) Field of Classification Search
　　CPC .. H05B 3/145; H05B 3/148; H05B 2203/014;
　　　　　　H05B 2203/017; C04B 35/76; C04B
　　　　　　37/005; C04B 35/80; C04B 35/565; C04B
　　　　　　2237/38; C04B 2235/5244; C04B
　　　　　　2237/083; C04B 2235/614; C04B
　　　　　　2235/5252; C04B 2235/404; C04B
　　　　　　2237/365; C04B 2235/5256; Y02E 30/30
　　USPC .................. 219/460.1, 200–215, 458.1–471,
　　　　　　219/520–553; 118/58–69, 620–643,
　　　　　　118/715–733; 427/69–96.8, 107–109,
　　　　　　427/123–124, 162–169, 230, 248.1,
　　　　　　427/255.23–255.394, 446, 497, 509, 569,
　　　　　　427/581, 585, 587–593
　　See application file for complete search history.

(56) References Cited

U.S. PATENT DOCUMENTS

| | | | |
|---|---|---|---|
| 3,148,102 | A | 9/1964 | Eakins et al. |
| 3,285,825 | A | 11/1966 | Jens |
| 3,308,031 | A | 3/1967 | Pon |
| 3,755,061 | A | 8/1973 | Schurb |
| 3,855,061 | A | 12/1974 | Triggiani et al. |
| 3,958,406 | A | 5/1976 | Corbiere |
| 4,076,380 | A | 2/1978 | DiMarcello |
| 4,539,248 | A | 9/1985 | Brockington et al. |
| 4,588,699 | A | 5/1986 | Brennan et al. |
| 4,751,044 | A | 6/1988 | Hwang et al. |
| 4,962,070 | A | 10/1990 | Sullivan |
| 5,094,804 | A | 3/1992 | Schweitzer |
| 5,096,739 | A | 3/1992 | Strutt et al. |
| 5,126,200 | A | 6/1992 | Nordine |
| 5,134,020 | A | 7/1992 | Cotteret et al. |
| 5,147,598 | A | 9/1992 | Kapil |
| 5,296,288 | A | 3/1994 | Kourtides et al. |
| 5,326,731 | A | 7/1994 | Bhola et al. |
| 5,342,022 | A | 8/1994 | Artjushenko et al. |
| 5,349,618 | A | 9/1994 | Greenspan |
| 5,399,430 | A | 3/1995 | Nordine et al. |
| 5,705,122 | A | 1/1998 | Curran |
| 5,786,023 | A | 7/1998 | Maxwell et al. |
| 5,867,552 | A | 2/1999 | Marlowe et al. |
| 5,955,391 | A | 9/1999 | Kameda et al. |
| 6,183,714 | B1 | 2/2001 | Smalley et al. |
| 6,291,058 | B1 | 9/2001 | Goujard et al. |
| 6,322,889 | B1 | 11/2001 | Lara-Curzio et al. |
| 6,323,413 | B1 | 11/2001 | Roth et al. |
| 6,359,374 | B1 | 3/2002 | Dausch et al. |
| 6,706,400 | B2 | 3/2004 | Mercuri et al. |
| 7,657,142 | B2 | 2/2010 | Gasca et al. |
| 7,666,475 | B2 | 2/2010 | Morrison |
| 9,206,508 | B1 | 12/2015 | Hariharan et al. |
| 9,217,210 | B2 | 12/2015 | Velev et al. |
| 9,658,087 | B1 | 5/2017 | Baur et al. |
| 9,896,385 | B2 | 2/2018 | Harrison et al. |
| 9,938,393 | B2 | 4/2018 | Schneiter et al. |
| 10,047,015 | B2 | 8/2018 | Pegna et al. |
| 10,546,661 | B2 | 1/2020 | Pegna et al. |
| 10,676,391 | B2 | 6/2020 | Harrison et al. |
| 10,876,227 | B2 | 12/2020 | Harrison et al. |
| 10,882,749 | B2 | 1/2021 | Pegna et al. |
| 11,534,936 | B2* | 12/2022 | Jin .......................... B28B 1/002 |
| 2002/0085968 | A1 | 7/2002 | Smalley |
| 2003/0168146 | A1 | 9/2003 | Wenstrup et al. |
| 2005/0048859 | A1 | 3/2005 | Canahan et al. |
| 2005/0082676 | A1 | 4/2005 | Andry et al. |
| 2005/0181192 | A1 | 8/2005 | Steffier |
| 2005/0247904 | A1 | 11/2005 | Raj et al. |
| 2005/0255033 | A1 | 11/2005 | Shimoji et al. |
| 2006/0039524 | A1 | 2/2006 | Feinroth et al. |
| 2006/0115648 | A1 | 6/2006 | Chen |
| 2007/0093587 | A1 | 4/2007 | Shen et al. |
| 2008/0143209 | A1 | 6/2008 | Tan et al. |
| 2008/0153959 | A1 | 6/2008 | Charati et al. |

| | | | |
|---|---|---|---|
| 2008/0175988 | A1 | 7/2008 | Chiu et al. |
| 2008/0237216 | A1* | 10/2008 | Goto ...................... H05B 3/143 |
| | | | 219/461.1 |
| 2009/0064476 | A1 | 3/2009 | Cross et al. |
| 2009/0220040 | A1 | 9/2009 | Takagi |
| 2010/0040834 | A1 | 2/2010 | Dawes et al. |
| 2010/0055352 | A1 | 3/2010 | Maxwell |
| 2010/0261058 | A1 | 10/2010 | Lopatin et al. |
| 2010/0320171 | A1 | 12/2010 | Mao et al. |
| 2011/0124483 | A1 | 5/2011 | Shah et al. |
| 2011/0170653 | A1 | 7/2011 | Cabrero et al. |
| 2011/0274906 | A1 | 11/2011 | Kim et al. |
| 2011/0286570 | A1 | 11/2011 | Farmer et al. |
| 2012/0002777 | A1 | 1/2012 | Lahoda et al. |
| 2012/0076718 | A1 | 3/2012 | Liu et al. |
| 2012/0135224 | A1 | 5/2012 | Guzman de Villoria et al. |
| 2012/0207264 | A1 | 8/2012 | Van Den Berghe et al. |
| 2012/0287553 | A1 | 11/2012 | Ramani et al. |
| 2012/0315467 | A1 | 12/2012 | Lafdi et al. |
| 2012/0315815 | A1 | 12/2012 | Fong et al. |
| 2013/0010915 | A1 | 1/2013 | Garnier et al. |
| 2013/0077731 | A1 | 3/2013 | Sherwood et al. |
| 2013/0093122 | A1 | 4/2013 | Schultz et al. |
| 2013/0106245 | A1 | 5/2013 | Giebe et al. |
| 2013/0163711 | A1 | 6/2013 | Zabiego et al. |
| 2013/0329849 | A1 | 12/2013 | Mazaudier |
| 2014/0170919 | A1 | 6/2014 | Manipatruni et al. |
| 2017/0326838 | A1 | 11/2017 | Pegna et al. |
| 2017/0331022 | A1 | 11/2017 | Pegna et al. |
| 2017/0369998 | A1 | 12/2017 | Pegna et al. |
| 2018/0057413 | A1* | 3/2018 | Lahoda ................... C04B 35/80 |
| 2018/0087157 | A1 | 3/2018 | Harrison et al. |
| 2018/0087214 | A1 | 3/2018 | Harrison et al. |
| 2018/0370860 | A1 | 12/2018 | Pegna et al. |
| 2019/0047047 | A1 | 2/2019 | Mark |
| 2020/0203028 | A1 | 6/2020 | Pegna et al. |
| 2021/0001511 | A1* | 1/2021 | Jin ........................... C04B 35/80 |
| 2021/0087726 | A1* | 3/2021 | Pegna .................... B33Y 70/00 |
| 2021/0222332 | A1 | 7/2021 | Harrison et al. |
| 2021/0230743 | A1 | 7/2021 | Harrison et al. |
| 2021/0253434 | A1 | 8/2021 | Pegna et al. |
| 2022/0064798 | A1 | 3/2022 | Schneiter et al. |

FOREIGN PATENT DOCUMENTS

| | | | |
|---|---|---|---|
| GB | 2054542 | B | 1/1983 |
| GB | 2553390 | A | 3/2018 |
| JP | S 61-132628 | A | 6/1986 |
| JP | H 01-252780 | A | 10/1989 |
| JP | H 03-285877 | A | 12/1991 |
| JP | H 07-252662 | A | 3/1995 |
| JP | H 09-268065 | A | 10/1997 |
| JP | H 10-059780 | A | 3/1998 |
| JP | 2002-211980 | A | 7/2002 |
| JP | 2005-231952 | A | 9/2005 |
| JP | 2013-210372 | A | 10/2013 |
| WO | WO 1988/001204 | A1 | 2/1988 |
| WO | WO 2010/090624 | A1 | 8/2010 |
| WO | WO 2012/109841 | A1 | 8/2012 |
| WO | WO 2012/129677 | A1 | 10/2012 |
| WO | WO 2013/180764 | A1 | 12/2013 |
| WO | WO 2014/143937 | A1 | 9/2014 |
| WO | WO 2015/200257 | A1 | 12/2015 |

OTHER PUBLICATIONS

Behlau, et al., "Mechanical Properties of Carbon and BN Coated SiC Fibers", Ceramic Engineering and Science Proceedings, vol. 24, No. 4, (Jan. 2003), pp. 225-230.
Chen, et al., "Carbide Derived Carbon (CDC) Coatings for Tyranno ZMI SiC Fibers", Ceramic Engineering and Science Proceedings, vol. 24, No. 3, (Jan. 2003), pp. 57-62.
Chen, et al., "Carbothermal Synthesis of Al—O—N Coatings Increasing Strength of SiC Fibers", International Journal of Applied Ceramic Technology, vol. 1, No. 1, Jan. 1, 2004 (pp. 68-75).

(56)                    References Cited

OTHER PUBLICATIONS

Duty et al., "Z-Pinning Approach for 3D Printing Mechanically Isotropic Materials", Additive Manufacturing, vol. 27, pp. 175-184 (May 2019) (Year: 2019).

Gan, Yong X., "Structural Assessment of Nanocomposites", Micron, vol. 43, Issue 7, (2012) pp. 782-817.

Glazoff, et al., "Morphological Analysis of Zirconium Nuclear Fuel Rods Braided with SiC: Quality Assurance and Defect Identification", Journal of Nuclear Materials, vol. 451, Issues 1-3, (Apr. 2014), pp. 216-224.

Hampden-Smith et al., "Chemical Vapor Deposition Metals: Part 1. An Overview of CVD Processes", 1995, Chem. Vap. Deposition, pp. 8-23 (Year: 1995).

Hu, et al., "Oxidation Behavior of Zirconium Diboride-Silicon Carbide at 1800° C.", Scripta Materialia, vol. 57, No. 9, (Nov. 2007), pp. 825-828.

Jiang et al., "Fabrication of Barium-Strontium Aluminosilicate Coatings on C/SiC Composites via Laser Cladding", Journal of Materials Science & Technology, vol. 33, No. 2, (2017), pp. 166-171.

Johansson et al., "Microfabrication of Three-Dimensional Boron Structures by Laser Chemical Processing", Journal of Applied Physics, vol. 72, No. 12, (1992), (8 pages).

Jouanny, et al., "Study of TiC Coatings on Nicalon Fibre Prepared by Pressure-Pulsed Reactive Chemical Vapour Deposition at Low Pressure", ECS Translations, vol. 25, No. 8, (Jan. 2009), pp. 1267-1272.

Kerans, et al., "High Temperature Composites", Air Force Research Laboratory Report No. AFRL-ML-WP-TP-2002-407, (Aug. 2002), (22 pages).

Kerans, et al., "Interface Design for Oxidation-Resistant Ceramic Composites", Journal of the American Ceramic Society, vol. 85, No. 11, (Nov. 2002), pp. 2599-2632.

Lee, et al., "Microstructure and Mechanical Properties of Al2O3/Y3Al5O12/ZrO2 Ternary Eutectic Materials", Journal of European Ceramic Society, vol. 25, No. 8, (Jan. 2005), pp. 1411-1417.

Liao, et al., "Large-Scale Aligned Silicon Carbonitride Nanotube Arrays: Synthesis, Characterization, and Field Emission Property", Journal of Applied Physics, vol. 101, No. 11, (Jun. 2007), pp. 114306.1-114306.4.

Liu, et al., "Monolithic Integration of Sampled Grating CBR with Electroabsorption Modulator by Combining Selective-Area-Growth MOCVD and Quantum-Well Intermixing", Chinese Physics Letters, vol. 25, No. 10, (Oct. 2008), pp. 3670-3672.

Longtin, et al., "Selective Area Synthesis of Aligned Carbon Nanofibers by Laser-Assisted Catalytic Chemical Vapor Deposition", Diamond & Related Materials, vol. 16 (2007) pp. 1541-1549.

Longtin, et al., "Synthesis of Carbon Nanofiber Films and Nanofiber Composite Coatings by Laser-Assisted Catalytic Chemical Vapor Deposition", Thin Solid Films, vol. 515, No. 5, (2007) pp. 2958-2964.

Luo, et al., "Microstructure, Tensile Strength and Thermostability of W-core SiC Fibers With or Without Carbon Coating", Materials Science & Engineering: A, vol. 647, (2015), pp. 265-276.

Marsh, John, "Quantum Well Intermixing Revolutionizes High Power Laser Diodes", Diodenlaser, Laser Technik Journal, vol. 4, No. 5, DOI: 10.1002/latj.200790190 (Nov. 2007) (4 pages).

Maxwell, et al., "Real-Time Volumetric Growth Rate Measurements and Feedback Control of Three-Dimensional Laser Chemical Vapor Deposition", Appl. Phys. A, vol. 67, No. 3, (1998), pp. 323-329.

Maxwell, et al., "Preparation of Superhard BxCy Fibers by Microvortex-Flow Hyperbaric Laser Chemical Vapor Deposition", Diamond & Related Materials, vol. 16, Issue 8, (Jan. 2007), pp. 1557-1564.

Maxwell et al., "High Temperature Nanocomposites for Nuclear Thermal Propulsion and In-Space Fabrication by Hyperbaric Pressure Laser Chemical Vapor Deposition", Journal of the British Interplanetary Society (JBIS), vol. 66, pp. 328-333 (Year: 2013).

Rosso, M., "Ceramic and Metal Metrix Composites: Routes and Properties", Journal of Materials Processing Technology, vol. 175 (2006), pp. 364-375 (Year: 2006).

Roy, et al., "Atomic Layer Deposition of Alumina Onto Carbon Fibers", Journal of the American Ceramic Society, vol. 94, No. 7, (Jul. 2011), pp. 2014-2022.

Shi et al., "Synthesis of Carbon Nanotubes by Laswer-Assisted Chemical Vapor Deposition", SPIE, p. 61070M-1-61070M-8 (Year: 2006).

Waku, et al., "An Amorphous Ceramic Al32.4Er7.6O60 Fiber with Large Viscous Flow Deformation and a High-Strength Nanocrystallized Ceramic Fiber", Journal of Materials Science, vol. 36, No. 10, (May 2001), pp. 2435-2440.

Wallenberger et al., "Strong, Small Diameter, Boron Fibers by LCVD", Materials Letters, vol. 14 (1992), pp. 198-202.

Wallenberger, Frederick T., "Inorganic Fibres and Microfabricated Parts by Laser Assisted Chemical Vapour Deposition (LCVD): Structures and Properties*", Ceramics International, vol. 23, (1997), pp. 119-126.

Wang, Mengxiao, M.S., "UV Laser-Assisted Diamond Deposition", The Graduate College at the University of Nebraska, (Nov. 2014), (100 pages), http://digitalcommons.uni.edu/cgi/viewcontent.cgi?article=1068&context=elecengtheses.

Wang, et al., "Synthesis of ZrC—SiC Powders from Hybrid Liquid Precursors with Improved Oxidation Resistance", Journal of the American Ceramic Society, vol. 98, No. 1, (Jan. 2015), pp. 197-204.

Wen, et al., "Interfacial Microstructure and Reaction of BN-Coated Single Crystal Al2O3 Fiber Reinforced NiAl Matrix Composites", Journal of Materials Science, vol. 37, No. 6, (Mar. 2002), pp. 1253-1258.

Zedlitz et al., "Properties of Amorphous Boron Nitride Thin Films", 1996, Journal of Non-Crystalline Solids, p. 198-200 (Year: 1996).

Zhang, et al., "Ferromagnetism Induced by Intrinsic Defects and Boron Substitution in Single-Wall SiC Nanotubes", Journal of Physical Chemistry, vol. 115, No. 35, (Sep. 2011), pp. 9987-9992.

Zimmerman, et al. "Fragmentation-Driven Grain Refinement in Directional Solidification of AlCu10wit-% Alloy at Low Pulling Speeds", Acta Materialia, vol. 126, (2017) pp. 236-250.

Harrison et al., "High Purity Ingot for Wafer Production", U.S. Appl. No. 17/580,990, filed Jan. 21, 2022 (34 pages) (Year: 2022).

Pegna et al., "Fiber Structures with Embedded Sensors", U.S. Appl. No. 17/658,665, filed Apr. 11, 2022 (49 pages) (Year: 2022).

International Search Report & Written Opinion for PCT Application No. PCT/US2022/071965, dated Jul. 19, 2022 (9 pages) (Year: 2022).

International International Preliminary Report on Patentability for PCT Application No. PCT/US2022/071965, dated Dec. 14, 2023 (7 pages).

* cited by examiner

1240

1200

1240

EMBEDDED WIRE CHEMICAL VAPOR DEPOSITION (EWCVD)

CROSS-REFERENCE TO RELATED APPLICATIONS

This application claims the benefit of U.S. Provisional Application Ser. No. 63/216,092, filed Jun. 29, 2021, entitled "Enhanced Ceramic Matrix Gas-Phase Infiltration and Deposition, and Embedded Wire Chemical Vapor Infiltration and Deposition (EWCVD)", and claims the benefit of U.S. Provisional Application Ser. No. 63/267,118, filed Jan. 25, 2022, entitled "Homogeneous and Heterogeneous Joining of Ceramic and Ceramic Matrix Composite Shells Using Embedded Wire Chemical Vapor Deposition", each of which is incorporated herein by reference in its entirety. Further, this application also relates to the following U.S. Letters Patents and/or U.S. Patent Publications, each of which is hereby incorporated herein by reference in its entirety: U.S. Pat. No. 10,546,661 B2, issued Jan. 28, 2020, and entitled "An Additive Manufacturing Technology for the Fabrication and Characterization of Nuclear Reactor Fuel"; U.S. Ser. No. 16/019,839, filed Jun. 27, 2018, entitled "Functional High-Performance Fiber Structure", which published Dec. 27, 2018, as U.S. Patent Publication No. 2018/0370860 A1; and U.S. Ser. No. 16/938,072, filed Jul. 24, 2020, entitled "Non-Woven Micro-Trellis Fabrics and Composite or Hybrid-Composite Materials Reinforced Therewith", which published Mar. 25, 2021 as U.S. Patent Publication No. 2021/0087726 A1.

STATEMENT REGARDING GOVERNMENT RIGHTS

Certain aspects of this invention were made with United States Government support under a U.S. Department of Energy Awards DE-SC0019912 and DE-SC0021665. Accordingly, the U.S. Government may have certain rights in this invention.

BACKGROUND

The present invention relates generally to the field of raw materials in fiber form, fibers for reinforcing material, and more specifically, to structures and methods to facilitate chemical vapor deposition (CVD) of a ceramic matrix to facilitate, for instance, the forming of a ceramic matrix composite (CMC) shell or the joining of elements, such as ceramic elements, including monolithic material ceramic elements and/or ceramic matrix composite elements.

SUMMARY

In accordance with one or more aspects, a method of forming a ceramic matrix is provided. The method includes obtaining a fiber preform to facilitate forming the ceramic matrix. The fiber preform includes a fiber layer with a plurality of fibers and a heating element embedded within the fiber preform. The method further includes heating the fiber element via the heating element embedded within the fiber preform. In addition, the method includes depositing matrix material into the fiber preform by embedded wire chemical vapor deposition (EWCVD) of the matrix material during the heating of the fiber preform by the heating element embedded therein. The embedded wire chemical vapor deposition of the matrix material within the fiber preform facilitates formation of the ceramic matrix. Advantageously, embedding the heating element within the fiber preform and depositing matrix material into the fiber preform by embedded wire chemical vapor deposition (EWCVD) to form the ceramic matrix results in more efficient matrix infiltration, without using a high-temperature chemical vapor deposition (CVD) furnace, and reduces the level of undesirable porosities and other defects in the ceramic matrix composite, while also decreasing fabrication costs and fabrication time.

In one or more embodiments, the plurality of fibers of the fiber layer include a plurality of non-woven ceramic fibers dispersed throughout the fiber layer, where the plurality of non-woven ceramic fibers conduct heat, at least in part, from the heating element during heating of the fiber preform. Advantageously, obtaining the fiber layer from a plurality of non-woven ceramic fiber is easier and less costly to produce than other options.

In one or more embodiments, the plurality of fibers of the fiber layer include a plurality of woven ceramic fibers within the fiber layer, where the plurality of woven ceramic fiber conduct heat, at least in part, from the heating element during heating of the fiber preform.

In one or more implementations, the ceramic matrix formed during the depositing of the matrix material includes a ceramic matrix composite shell. For instance, in one embodiment, the ceramic matrix formed during the depositing of the ceramic matrix includes a ceramic matrix composite shell with a closed-surface envelope.

In one or more embodiments, the heating element includes a resistive element, and the resistive element includes an ordinarily solid material selected from a group consisting of boron, carbon, silicon, aluminum, phosphorus, gallium, germanium, arsenic, titanium, zirconium, niobium, molybdenum, hafnium, tantalum, tungsten, rhenium, osmium, nitrogen, and combinations thereof.

In one or more embodiments, the fiber layer with a plurality of fibers is a first fiber layer with a first plurality of fibers, and obtaining the fiber preform includes obtaining the fiber preform with a second fiber layer with a second plurality of fibers over the first plurality of fibers and the heating element, with the heating element embedded between the first fiber layer and the second fiber layer. The first fiber layer with the first plurality of fibers and the second fiber layer with the second plurality of fibers facilitate, during the depositing of the matrix material, formation of the ceramic matrix. In one embodiment, the first plurality of fibers of the first fiber layer include a first plurality of non-woven ceramic fibers, and the second plurality of fibers of the second fiber layer include a second plurality of non-woven ceramic fibers.

In one or more implementations, the method further includes positioning, prior to the heating and the depositing, the fiber preform to facilitate joining ceramic elements via the ceramic matrix.

In one or more embodiments, the ceramic elements are formed of the same monolithic material(s), or in one or more other embodiments, of dissimilar monolithic material(s). In one or more implementations, the ceramic elements are formed of the same ceramic matrix composite, or in one or more other embodiments, of dissimilar ceramic matrix composites. The embedded wire chemical vapor deposition (EWCVD) of the ceramic matrix facilitates joining a variety of ceramic element materials.

In another aspect, a method of forming a fiber preform for facilitating formation of a ceramic matrix is provided, which includes: forming a fiber layer with a plurality of fibers to facilitate forming the ceramic matrix, and associating a heating element with the fiber layer to form the fiber preform. The heating element is to facilitate heating of the fiber preform for depositing of a matrix material within the fiber layer via embedded wire chemical vapor deposition (EWCVD) to facilitate formation of the ceramic matrix.

In a further aspect, a fiber preform for facilitating formation of a ceramic matrix is provided. The fiber preform includes a fiber layer with a plurality of fibers to facilitate forming the ceramic matrix, and a heating element embedded within the fiber preform. The heating element is to facilitate heating the fiber preform for depositing of a matrix material within the fiber preform via embedded wire chemical vapor deposition (EWCVD) to facilitate formation of the ceramic matrix.

Additional features and advantages are realized through the techniques described herein. Other embodiments and aspects of the invention are described in detail herein and are considered a part of the claimed aspects.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
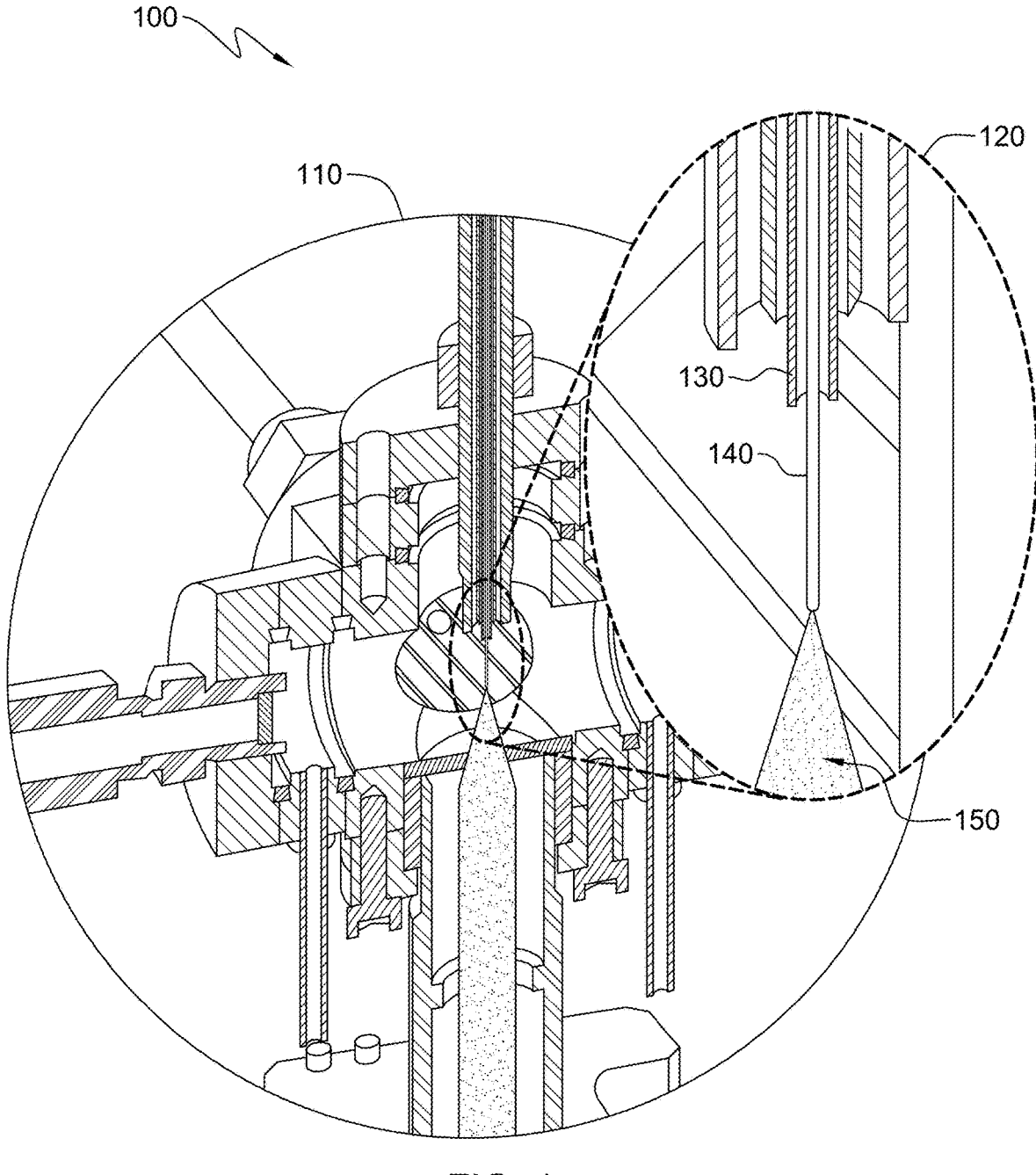
FIG. 1 is a schematic representation of a fiber reactor, showing a seed fiber substrate, a reactor into which precursor gasses are delivered, a focused laser beam impinging on the seed fiber, and one or more reactor windows that are transparent to the incoming laser beam wavelength and allow for monitoring of a fiber fabrication process, in accordance with one or more aspects of the present invention.

Aspects of the present invention and certain features, advantages and details thereof, are explained more fully below with reference to the non-limiting example(s) illustrated in the accompanying drawings, which may not be drawn to scale for ease of understanding. Descriptions of well-known systems, devices, fabrication and processing techniques, etc., are omitted so as to not unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application of, for instance, fabricating a fiber preform with an integral heating element for embedded wire chemical vapor deposition (EWCVD) formation of a ceramic matrix, for instance, to form a ceramic matrix composite (CMC) shell, or to join ceramic elements, such as described herein.

Aspects of the present invention are built upon an advanced manufacturing paradigm, inspired from cross-cutting advances in additive manufacturing (AM), micro-electromechanical-systems (MEMS) design and nano-fabrication, and ceramic matrix composites (CMCs).

Before describing detailed embodiments of certain novel fiber preforms with embedded heating elements, and embedded wire chemical vapor deposition (EWCVD) formation of a ceramic matrix, certain definitions are provided to aid in the description.

Additive manufacturing (AM) is a technology whereby constituent materials are joined together to form a desired object, usually under computer control. The constituents can come in the form of elemental molecules, point-like elements such as powders, line-like elements such as fibers, filaments, and extruded pastes, surface-like elements such as tapes and sheets, or volume-like elements such as bricks. Examples of additive manufacturing processes that proceed from elemental molecules include Chemical Vapor Deposition (CVD) or Physical Vapor Deposition (PVD) used in producing microelectronics. Numerous additive manufacturing processes proceed from flat layers of powder where individual grains are joined together selectively and bonded to the underlying layer to form an incremental cross-sectional layer of the object under construction. Filament winding and fused deposition modeling are examples of additive manufacturing processes where the constitutive material is brought in as a line-like element. Tape layup and laminated object manufacturing are examples of additive manufacturing processes where the constitutive elements are brought in as sheet-like elements.

When additive manufacturing processes build up a material object in layers, the technique is usually referred to as 3-D printing, by analogy to 2-D printing on a sheet of paper.

Additive manufacturing, as disclosed in certain embodiments herein, can have a great effect on fiber layer structures and fiber preform structures. The fundamental AM technique upon which fibers can be built is Laser-Induced Chemical Vapor Deposition (LCVD).

The vast majority of previous additive manufacturing processes are strongly dependent upon the properties of the build material. For example, joining powders by locally melting them requires a precise knowledge of the melting point and a precise control of the local temperature during buildup. Very few additive manufacturing processes can function independently of material properties, and those that do are called "material agnostic".

LCVD is used in embodiments disclosed herein as a fundamental AM tool due to its near material independence, which is a rare property for AM processes. LCVD is a technique derived from CVD, used intensively in the microelectronics fabrication industry (aka "Chip Fab"). CVD builds up electronics-grade high-purity solid deposits from appropriate gas precursors. In its 75+ year history, Chip Fab has accumulated an impressive library of chemical precursors for a wide range of materials, numbering in the 10's of thousands. The main difference between CVD and LCVD resides in dimensionality and mass throughput. CVD is intended for 2-D film growth whereas LCVD is suited for one-dimensional filamentary structure processing such as disclosed herein. The dimensionality difference means that deposition mechanisms are greatly enhanced for LCVD vs. CVD, leading to deposited mass fluxes (kg/m2 s) that are 3 to 9 orders of magnitude greater. For example, diamond-like carbon filaments have been measured at linear growth rates upwards of 13 cm/s, which represents a 9 order of magnitude increase in mass flux compared to thin film CVD of the same material. Finally, compared to existing manufacturing, LCVD is essentially containerless, which virtually eliminates opportunities for material contamination by container or tool. Thus, according to embodiments disclosed herein, LCVD, and 1½D-printing, further described below, allow for the material and length of a fiber to be tightly controlled. Additionally, due to the change in focus of the laser and the containerless growth, the material of a fiber is capable of being altered or completely changed to a new material system in situ, such as during growth of a fiber structure, allowing for nearly instantaneous changes to the material system of the fiber.

Many applications of aspects of the present invention can be implemented by material-agnostic AM processing, such as the capability to fabricate one or more fiber layers of a fiber preform in a manner that is material agnostic.

As described herein, a new design space is used in one or more embodiments, from which manufacturing can emerge as an axiomatic-based science. In one embodiment, the ability to print fibers utilizing fundamental properties that are formally defined herein as "1½-D Printing" AM (by analogy to 3-D printing), is employed in forming fibers for fiber preforms (with embedded heating elements), such as disclosed.

To implement 1½-D printing, Laser Induced Chemical Vapor Deposition (LCVD) is chosen herein as the fundamental Additive Manufacturing (AM) tool for its near material independence—a rare property for AM processes. Such a process is said to be "material agnostic".

For the purpose of this application, the term "1½-D Printing" designates an AM process exhibiting the following defining properties:

1. Material-agnostic ability to grow fibers or filaments;
2. Ability to vary diameter and axis along the length of the fiber or filament;
3. Material-agnostic ability to vary composition along the length of the fiber or filament; and
4. Material-agnostic ability to deposit materials onto specific sections of fibers or filaments with a desired morphology, and thickness.

These four axiomatic properties constitute a set of manufacturing tools that defines a new range of filamentary constructs, unleashing new fiber designs and uses, certain examples of which are discussed herein.

For instance, using embodiments described herein, there is an ability to grow filaments in a material-agnostic method or methods, meaning that the material or materials of a fiber, or filament, according to embodiments described herein, can be altered in stoichiometry, or completely changed during the growth of the fiber, or filament. For example, High Performance Fibers (HPFs) can be provided for expanding uses in many specialized applications, such as military and aerospace (turbo machinery, rockets, advanced structures), automobile, biomedical, energy, and other applications that require advanced materials with exceptional strength, stiffness, heat resistance, and/or chemical resistance. HPFs are sought when a combination of extreme material properties is required which cannot be met by existing metal filaments or by carbon, glass, vegetal, or mineral fibers. HPF composite systems disclosed herein generally include a plurality of fiber structures, distributed within a matrix material, such as a ceramic matrix composite (CMC).

Traditionally, fiber formation is often accomplished by passing a liquid precursor through a spinneret. For example, the spinneret is typically a plate with a pattern of tiny holes through which a liquid precursor is fed. Upon exit, the stream pattern gels into filaments called "green fibers". This process assumes that the fiber material can exist in either a liquid, gel, or plastic form that lends itself to flowing through a small opening. In many instances, and especially for refractory materials, such a liquid or near liquid state does not exist.

A better approach disclosed herein involves extracting a fiber (for inclusion in a fiber preform) out of a laser focus where the fiber is created from surrounding fluid precursors. In one embodiment, a laser is focused on the fiber tip thereby heating the fiber to temperatures at which the precursors dissociate, and Chemical Vapor Deposition (CVD) takes place. The fiber grows in length and is pulled out of the reaction zone at the growth rate, resulting in the creation of an arbitrarily long monofilament fiber. This process technology, used according to embodiments of the current invention, is illustrated by FIG. 1.

FIG. 1 is a schematic of an exemplary process which utilizes (in one embodiment) a reactor 100, which is shown in partial cross-section view 110 to include an internal reactor chamber, and in enlarged view 120, a growth region within the chamber. As illustrated, a self-seeded fiber 140 grows towards an oncoming coaxial laser 150 and is extracted through an extrusion microtube 130. In one or more embodiments, CVD precursors are injected into the reaction zone from the extrusion microtube forming a small, high concentration plume around the reaction zone that feeds and convectively enhances growth. This plume can be embedded in a coaxial flow of inert gas that shields the reaction and carries away diluted by-products. This reactor design builds upon understanding of Laser Induced Chemical Vapor Deposition (LCVD) fiber growth, and is suited for rapid development of specialty filaments with diameters such as disclosed herein.

Further, note that large scale replication of fiber growth and fiber processing can advantageously be used, in one embodiment. Pure optical parallelization for fiber growth is one approach to mass production of fibers. For example, parallelization of the process technology illustrated by FIG. 1 can be pursued.

In pursuing large scale manufacturing objectives, however, certain features of the FIG. 1 approach should be preserved, such as:

Feature 1—Convection enhanced high-pressure precursor flow—has been shown to optimize single fiber growth.

Feature 2—Imaging at wavelengths that are specific to byproducts (e.g. Hydrogen at 656 nm)—provides for direct observability of fiber growth and has been used for process control.

Features 3 and 4 respectively—Containerless and material-agnostic-form the basis for a platform technology capable of processing a wide range of materials.

Figure 2:
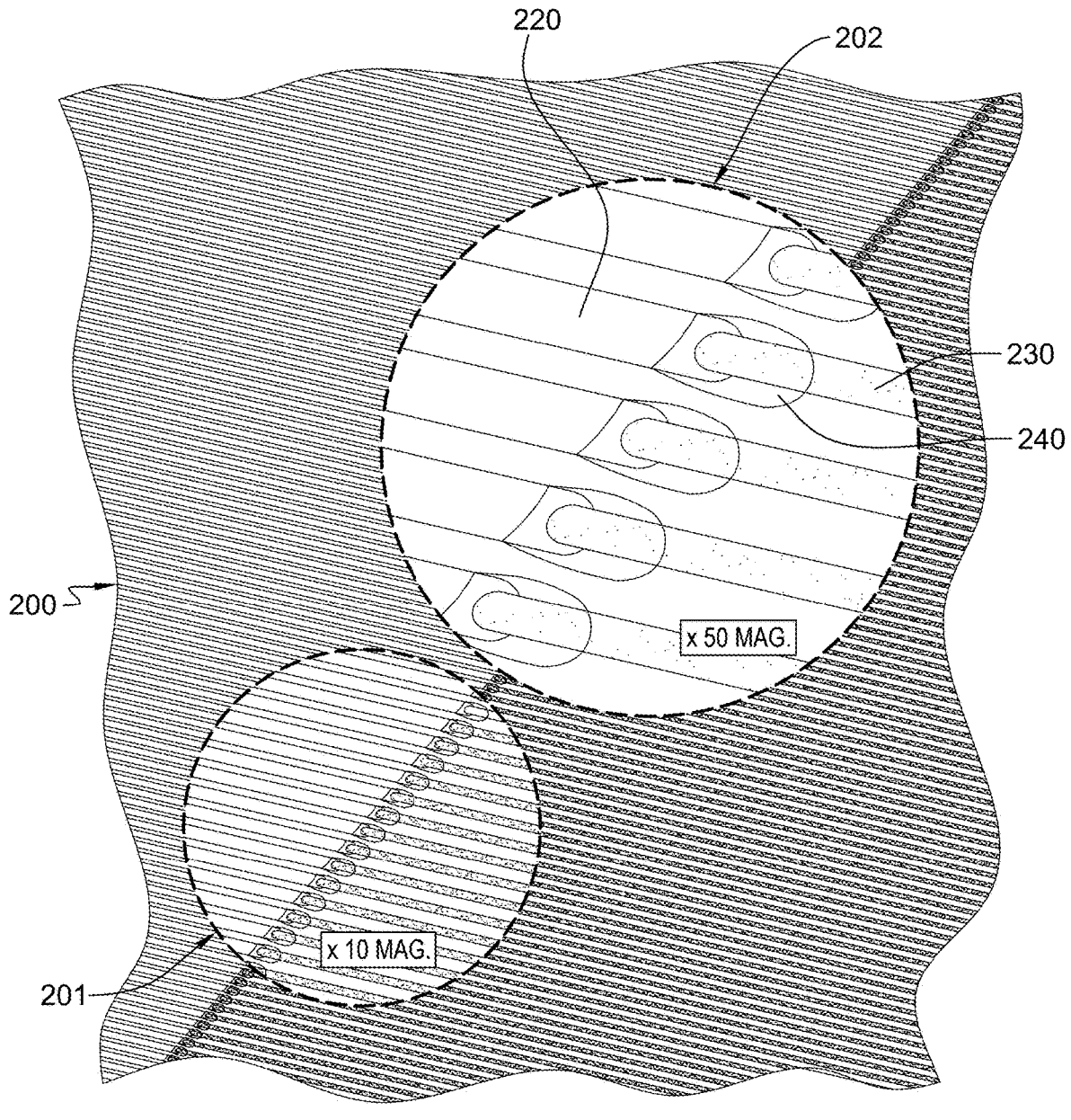
FIG. 2 is a schematic representation showing how laser-induced chemical vapor deposition (LCVD) processing can be parallelized by multiplication of laser beams for use in a fiber structure fabrication process, in accordance with one or more aspects of the present invention.

The present invention, in one or more embodiments, can utilize a large array of independently controlled lasers, to grow a large array 200 of fibers 220 in parallel, as illustrated in FIG. 2. In one embodiment, fiber LCVD growth can be massively parallelized from a filament lattice by multiplication of laser beams 230 that include a plasma 240 around the tip of each fiber 220. By way of example, the array of fibers are shown with 10× magnification 201, and 50× magnification 202 in FIG. 2.

Figure 3:
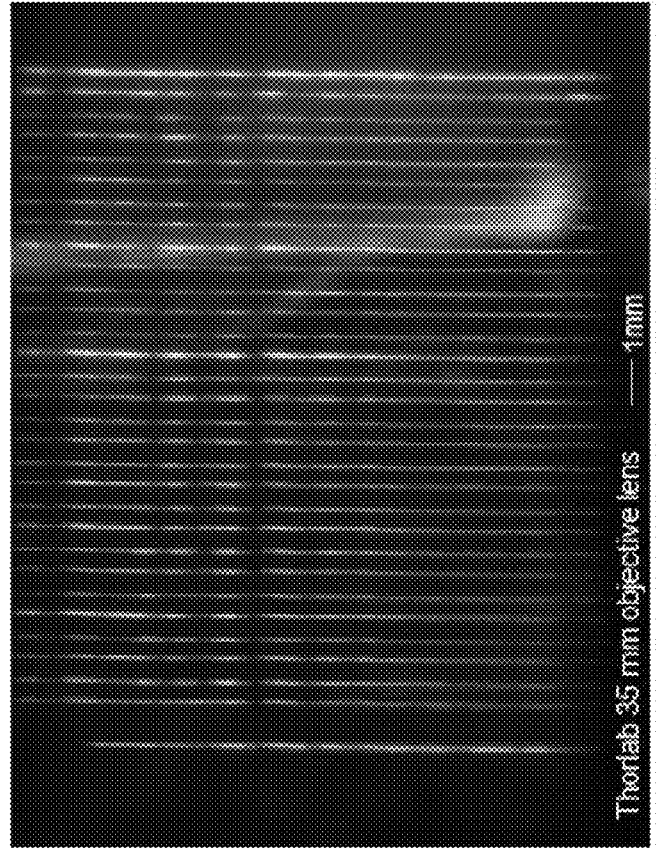
FIG. 3 is an example of parallel LCVD growth of carbon fibers, which can be used as scaffold fibers in one embodiment of a fiber structure fabrication process, in accordance with one or more aspects of the present invention.
Figure 3:
Figure 3:
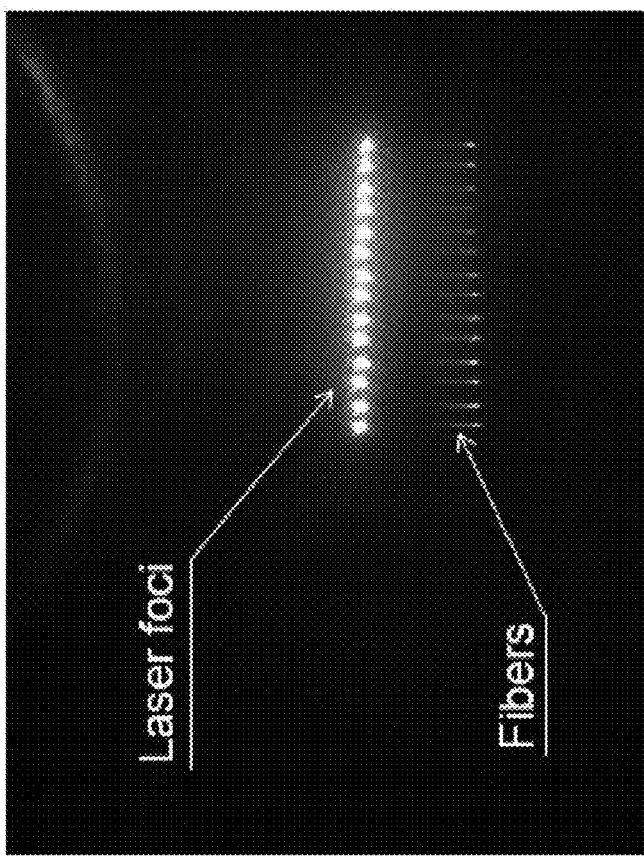

Using a Computer to Plate (CtP) (e.g., Quantum Well Intermixing (QWI)) laser array for LCVD combined with the use of a shallow depth of laser focus, provides beneficial results. In one embodiment, the shallow depth of laser focus can be 100 microns or less in total linear length of depth of focus. By way of example, FIG. 3 shows one embodiment of parallel LCVD growth of carbon fibers using a unit with multiple lasers, for instance 64 or more. The left figure shows fibers during growth, and the right figure shows the resulting grain fibers. Note that the diameter and length of fibers grown using laser induced chemical vapor deposition (such as discussed herein) can vary. In one or more embodiments, the diameter of the grown fiber is 100 micron or less, for instance, 50 microns or less, such as in the range of 20-30 microns.

A fiber diameter in the range of 100 microns or less has advantages during EWCVD deposition of matrix material into the fiber preform, such as disclosed herein. Advantageously, such fibers have a small thermal mass, which facilitates heat generated by the embedded heating element within the fiber preform being conducted throughout the fiber layer(s) to facilitate deposition of the matrix material from inside the preform, outward, such as described herein.

In prior uses, the laser beam has been focused to a diffraction limited spot with long Rayleigh range. In accordance with the present invention, not only is the focus intense enough to sustain CVD, but the shallow depth of focus means that fibers can only grow in a small region in the front and back of the image plane. This goes against commonly accepted practice in LCVD where long depths of field are favored to maximize the growth region. The advantage of a shallow depth of field is important because of the level of control it can afford. For example, if one fiber stopped growing for any reason, the focus can be moved back to that fiber tip. All other growths would stop and then restart as the lagging fiber is pulled back to the same level as the others.

The effect of a shallow depth of focus, according to some embodiments of the invention, is also illustrated in FIG. 3. In particular, significant benefits are evident in FIG. 3; that is, fibers are grown in unison, and to the same height. This is an unexpected benefit of source imaging over diffraction limited optics because the depth of focus is 5 to 30 times (vertical and horizontal, respectively) shallower than the Rayleigh range of an equivalent diffraction limited focus. This turns out to be advantageous as fibers quickly grow in and out of focus. This makes it possible to track fiber growth, and even backtrack to retrieve fibers that stopped growing without affecting any of the other already grown fibers. This unique feature of the CtP laser bars is expected to represent a major advantage in controlling future parallel LCVD growth for fiber arrays.

Figure 4:
FIG. 4 is an image of a batch of exemplary fibers formed for inclusion in one or more fiber preforms for facilitating joining ceramic elements, in accordance with one or more aspects of the present invention.

By way of example, FIG. 4 is an image of a batch of exemplary LCVD-formed fibers, such as LCVD-formed ceramic fibers (e.g., silicon carbide fibers), which can be used, in one or more embodiments, in forming one or more fiber layers of a preform configured for embedded wire chemical vapor deposition (EWCVD) formation of a ceramic matrix, in accordance with one or more aspects of the present invention.

Aspects of the present invention improve upon the state of the art of ceramic matrix composite (CMC) manufacturing. Conventionally, gas-phase ceramic matrix infiltration and deposition is effected via chemical vapor infiltration (CVI) and chemical vapor deposition (CVD) onto a ceramic or carbon preform in a furnace chamber. This process thermally drives the deposition of the matrix in the furnace when heated above the decomposition temperature of the precursor. The entire process chamber is heated, hence the process demands far more energy than actually needed to produce only the desired part. As a result of using a furnace chamber, thermal gradients are operating from outside the preform inward, depositing the matrix preferentially on the outside of the fiber preform, and leaving undesirable porosities within the composite. Advantageously, aspects of the present invention reverse the thermal gradient to drive CVI/CVD from inside out, generating heat from within the preform to be infiltrated. This results in a more economical process since no furnace is required, which reduces the environmental process footprint since less energy is required, and improves the economics of the CMC manufacturing.

As explained in detail herein, novel processes are disclosed to improve the formation of a ceramic matrix composite. For instance, in one or more embodiments, a heating element is embedded within a preform, such as a ceramic fiber preform. As heat is generated by the heating element from within the fiber preform, a thermal gradient is created directed from inside the preform, outward. As the ceramic matrix forms on the embedded wire and the surrounding fibers, it conducts heat, enhancing the formation of the matrix. This process advantageously improves on prior approaches, by reducing the level of undesirable porosities and other defects in the resultant CMC, while decreasing energy used, as well as fabrication time and fabrication costs.

By way of further explanation, deposition rates in pyrolytic chemical vapor deposition (CVD) are thermally driven, to a point. CVD growth exhibits three regimes with increasing temperature, that is, a kinetic regime, a diffusion limited regime, and a thermodynamic regime. In the kinetic regime, past an activation temperature Ta, the deposition rate increases exponentially following an Arrhenius law, as long as precursor gases can diffuse in and by-products can diffuse out of the reaction zone. At that point, diffusion limits become dominant and the deposition rate flattens. As the temperature rises, material becomes etched away. This is the thermodynamic regime. This pattern is the same regardless of dimensionality of the mass transport.

Modeling has shown that the 3D (and 2D) diffusion limit can be greatly increased by induced anisotropy. For example, diffusion in and out of the reaction zone during laser-induced chemical vapor deposition (LCVD) fiber growth is not isotropic; a serendipitous occurrence that contributes greatly to process efficiency. When growing a 1-D fiber, high-temperature reaction by-products are ejected from the fiber tip against the incoming laser at high speed. This jet entrains an axial flow of fresh precursor preceding from the base of the fiber towards the tip. The existence of this jet has been confirmed both numerically and experimentally. This discovery has led to a key defining feature of the processes disclosed herein. In particular, to enhance growth rate, it has been discovered that forced convection should not counteract the laser-induced diffusion anisotropy. Therefore, precursor flow is introduced as near axial as possible in order to raise the mass transport limit, but not so large as to convectively cool the fiber below the pyrolytic decomposition temperature.

Embedded wire chemical vapor deposition (EWCVD) disclosed herein builds upon the recognition that dimensionality of mass-transport has a large influence on CVD/CVI. Mass transport to a fiber growth from an LCVD (diffusion to a point) process is about a billion times that of 1-dimensional diffusion in thin film deposition, accounting for the effect of anisotropy. Two-dimensional diffusion to a line, too, is much more efficient that 1-D diffusion to a plane. The embedded wire chemical vapor deposition (EWCVD) disclosed herein exploits this phenomenon.

In one or more embodiments, EWCVD allows infiltration of a shell fiber preform without the use of a high-temperature CVD furnace, and also limits thermal exposure to the infiltrated preform. This can be accomplished, in one embodiment, by inserting a resistive wire within the fiber preform, inserting the preform in an unheated process chamber containing the precursor gases, and resistively heating the wire.

In one or more embodiments, ceramic fibers, such as silicon carbide (SiC) fibers or carbon fibers, are included within the preform and operate to disperse the generated heat, causing mass transport CVD to occur onto the fibers, along with a strong thermal gradient oriented from the inside of the preform, outward. This is a significant departure from traditional hot-wall CVD, in which matrix formation progresses from the outer circumference of the preform inward, with essentially no thermal gradient at the infiltrated surface, and typically leaving the resultant composite riddled with closed porosities.

Figure 5:
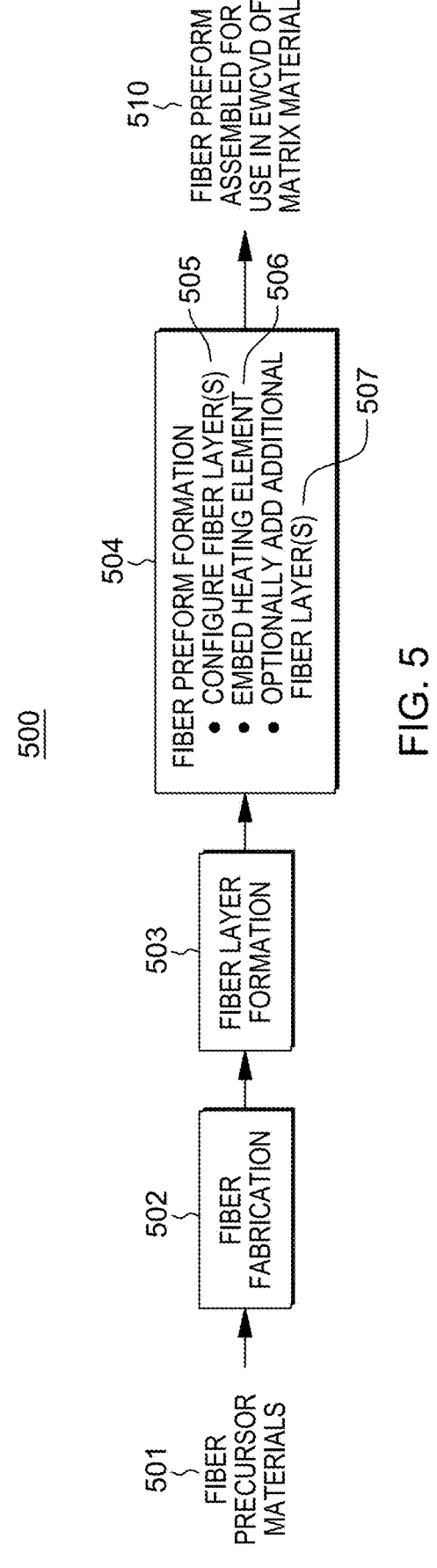
FIG. 5 depicts one embodiment of a process for producing a fiber preform for embedded wire chemical vapor deposition (EWCVD) of a matrix material, in accordance with one or more aspects of the present invention.

FIG. 5 depicts one embodiment of a process 500 for producing a fiber preform with an embedded heating element for use in EWCVD formation of a ceramic matrix, in accordance with one or more aspects disclosed herein. Initially, fibers are obtained or fabricated 501 using (in one embodiment) one or more fiber precursor materials 502 and laser-induced chemical vapor deposition (LCVD), such as described herein. In one or more implementations, laser-induced chemical vapor deposition is used to produce short ceramic fibers, for example, silicon carbide fibers of 1 inch or less in length. In one embodiment, the fibers can be produced and collected continuously, or in batch. Under certain conditions (e.g., high laser power), the process can be used to produce high-purity stoichiometric fibers, such as beta-SiC fibers, that can be used as a feedstock to be milled to produce high-purity powders. These powders can also be used as matrix filler for the joint, in one or more embodiments.

Figure 14A:
FIG. 14A depicts an optical microphotograph of a plurality of non-woven ceramic fibers coated with an interphase layer, such as a pyrolytic carbon layer, in accordance with one or more aspects of the present invention.
Figure 14B:
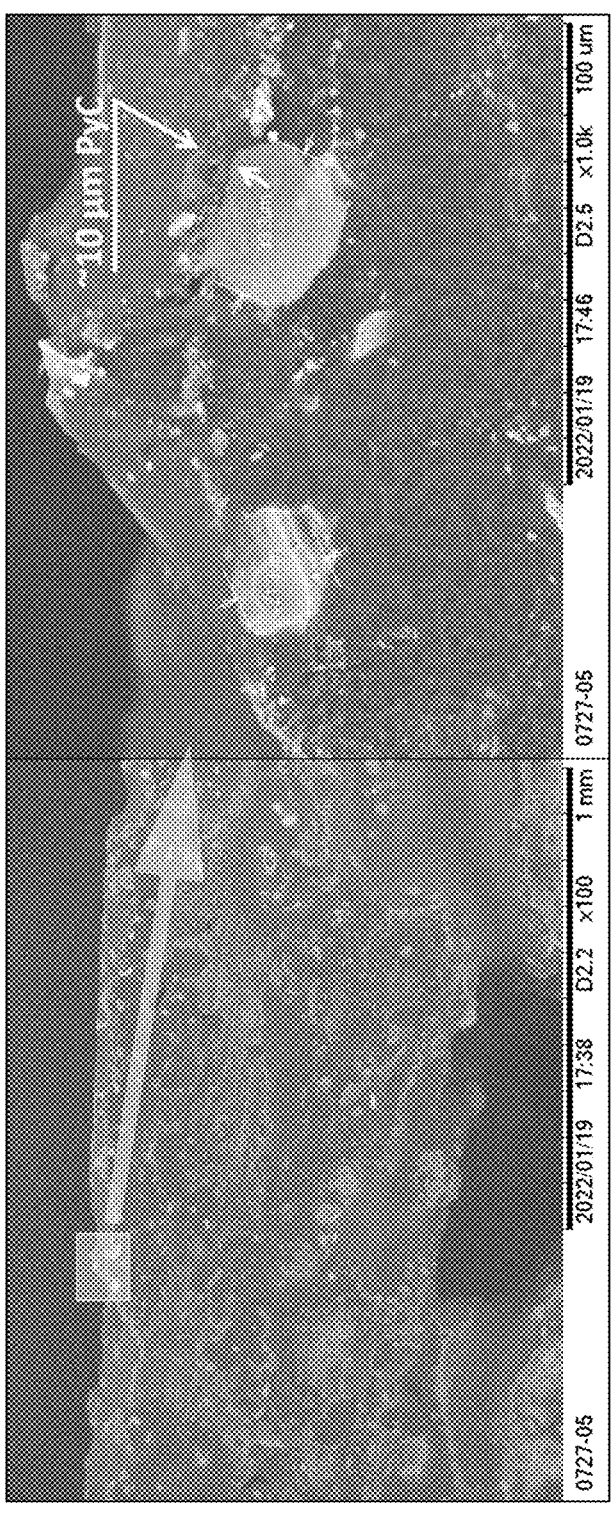
FIG. 14B is a scanning electron microscope image of a resultant ceramic matrix composite (CMC) in polished cross-section (on the left side), with a magnified area (on the right side) showing exemplary silicon carbide fibers with a pyrolytic carbon interphase, in accordance with one or more aspects of the present invention.

In one or more embodiments, a plurality of fibers, such as a plurality of non-woven ceramic fibers or a plurality of woven ceramic fibers, are used in fiber layer formation 503 for a fiber preform, such as disclosed herein. For instance, in one specific embodiment, short silicon carbide (SiC) non-woven fibers can be formed and used to produce one or more fiber layers or sheets from the fibers. Though this is only one example, such fiber layers or fabrics can in turned be used as reinforcement for a ceramic matrix to be formed with, for instance, the fibers being coated with an interphase layer. The interphase layer is used in the ceramic matrix composite to yield a desired fracture toughness behavior that prevents the composite from performing mechanically as a brittle monolithic ceramic body. The interphase layer is deposited on the fiber reinforcement phase, in one embodiment as a non-woven sheet as shown in FIG. 14A. The interphase acts as the preferred pathway for crack propagation because of its layer crystallographic structure. The interphase material has a characteristic inter-layer strength that tends to be much weaker than the intra-layer strength, which leads to an energetically favored path for a crack to travel along the length of a fiber, as opposed to through a fiber. In this manner, fracture energy is consumed by the longer linear lengths that the crack will traverse, thereby leading to an increased fracture toughness in the composite. FIG. 14B depicts a silicon carbide matrix embodiment with a pyrolytic carbon interphase deposited on silicon carbide fibers embedded within the matrix, by way of example only.

In one or more implementations, fiber layers can also be formed by combining short LCVD fiber fabrication with a fiber shaping ability to optimize composite toughness. For instance, short fibers that are shaped as teardrops or elongated diamonds can have significantly increased strength. Further, use of variable diameter fibers within the fiber layer(s) can enhance toughness and increase fatigue life by an order of magnitude.

Figure 6:
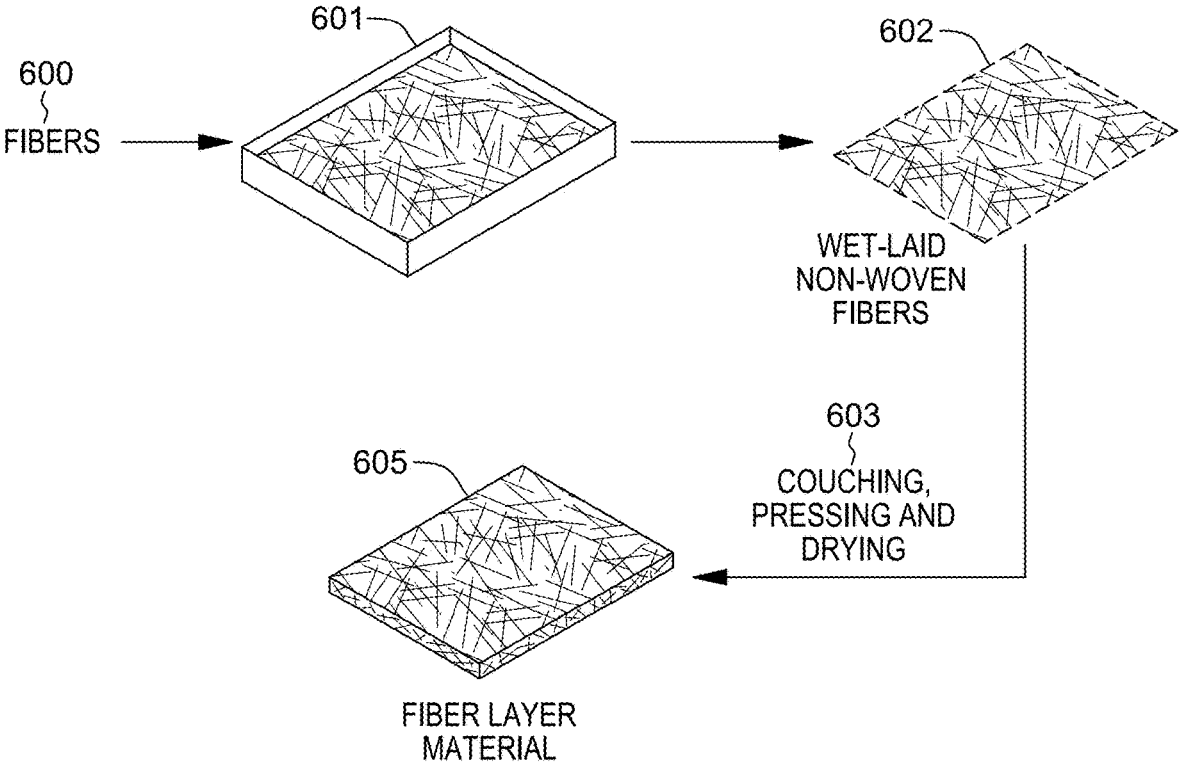
FIG. 6 depicts one embodiment of a process of forming a fiber layer with a plurality of fibers for embedded wire chemical vapor deposition (EWCVD) of a ceramic material, in accordance with one or more aspects of the present invention.

One embodiment of non-woven fiber layer formation is depicted in FIG. 6, by way of example only. As illustrated, a plurality of non-woven fibers, such as a plurality of LCVD-grown ceramic fibers (for example, carbon or silicon carbide fibers) are provided and placed into a vat or container 601 along with an appropriate solution used in a wet-laying process to obtain wet-laid, non-woven fibers 602 (in one example). Note that in this example, the fiber layer being formed is a non-woven sheet or veil created through wet-laid processing of fibers, such as short LCVD-produced fibers, for instance, in the range of 50 millimeters or less. Wet-laid methods to produce the fiber layer can be similar to those processes used in paper making.

In one specific embodiment, non-woven fiber-based layers can be fabricated by dispersing the fibers in an aqueous solution through control of the chemistry and pH of the liquid used, such as water. Once the fibers are suspended in the liquid medium, a non-woven fiber layer can be formed by passing the solution over a perforated metal plate or screen, allowing the fibers to settle out onto the support, and form an interconnected web, while the excess solution drains out. This can be accomplished in a batch manner on a single screen, or continuously via a moving screen belt. In one or more embodiments, the wet-laid, non-woven fibers can be held together by fiber-to-fiber entanglement and friction. Additional fiber layer strength can be achieved, if needed, by the addition of a binding agent, such as polyvinyl alcohol, which can be burned off at relatively low temperatures (e.g., approximately 400° C.). A minimum density of fibers is desirable in order for the fiber layer to form on the screen, which can be measured by a layer or veil description of grams per square meter (GSM) loading. For instance, in one or more implementations, the fiber layer being formed is in the range of 300-600 grams per square meter density of fiber loading to achieve desirable mechanical performance in the resultant composite structure. Once the wet-laid, non-woven fiber structure 602 is obtained, couching, pressing and drying 603 can be used to obtain a fiber layer 605 with a desired plurality of fibers dispersed throughout the layer for use in a fiber preform, such as disclosed herein. Other products manufactured by similar wet-laid processing include battery separators, vacuum filter bags, and many types of medical tape.

Returning to FIG. 5, the fiber preform is formed 504 using the fiber layer material 503 by configuring the fiber layer 505, such as by one or more of sizing, shaping, bending, etc., the fiber layer into the desired shape, such as around one or more ceramic elements. In one or more embodiments, multiple fiber layers can be stacked to obtain a desired fiber layer thickness for the fiber preform. A heating element 506, such as a resistive wire selected and sized to facilitate heating the preform for EWCVD, is associated with the fiber layer to form one embodiment of a fiber preform 504, in accordance with one or more aspects of the present invention. Note in this regard that, although referred to herein as an embedded wire chemical vapor deposition process, heating element 506 can be formed of a variety of resistive materials, including metal material and non-metal materials. For instance, in one or more embodiments, the heating element can be formed of tungsten, molybdenum, carbon, etc., as desired for a particular application. Heating element 506 is selected and configured to operate in the desired temperature range for the EWCVD process. For instance, in one embodiment, the desired temperature range can be, for instance, in the range of 600° C. to 2000° C. to facilitate the deposition process.

Optionally, one or more additional fiber layers 507 can be added over fiber layer(s) 505 and heating element 506 in the fiber preform, such that the heating element is positioned between fiber layers. In one or more further embodiments, an inactive (or passive) wrap is provided over the one or more additional fiber layers to hold the layers in place until embedded wire chemical vapor deposition of the ceramic matrix has occurred. For instance, in one embodiment, a carbon fiber wrap can be used along the length of the preform. This carbon fiber wrap would not be electrically connected during heating of the preform, but rather serve to mechanically secure in place the additional fiber layer(s) over the embedded heating element. Advantageously, such an inactive or passive wrap operates to hold the outer fiber layer(s), and other components of the preform in place during the matrix formation process. The fabricated fiber preform can then be used 510 in one embodiment for EWCVD formation of a ceramic matrix, such as ceramic elements, in accordance with one or more aspects of the present invention.

Figure 7A:
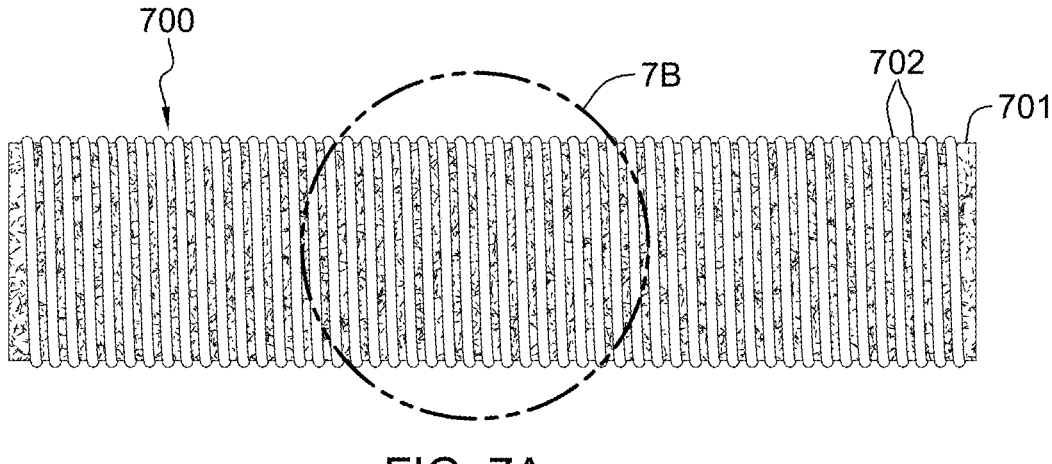
FIG. 7A illustrates one embodiment of a fiber preform for embedded wire chemical vapor deposition (EWCVD) of a ceramic matrix, in accordance with one or more aspects of the present invention.
Figure 7B:
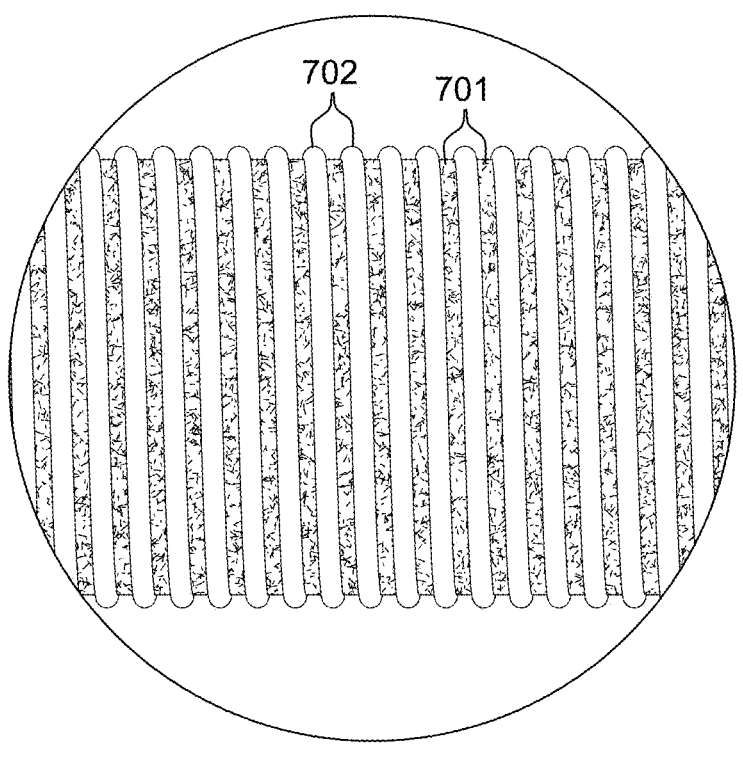
FIG. 7B is a partially enlarged depiction of the fiber preform of FIG. 7A, taken along line 7B thereof, in accordance with one or more aspects of the present invention.

By way of example, FIGS. 7A-7B depict one embodiment of a fiber preform 700, such as described herein, in position around a ceramic element, such as a tube, for (for instance) bonding of a ceramic matrix to the element to define a ceramic matrix composite (CMC) shell about the element. As discussed, fiber preform 700 includes a fiber layer with a plurality of fibers, such as a plurality of non-woven fibers 701 in one or more layers wrapped around the ceramic element, and a heating element 702, such as a resistive wire, wrapped around fiber layer 701 to physically contact the fiber layer and hold the fiber layer in place against the tube. By way of example, fiber layer(s) 701 includes a plurality of ceramic fibers, such as a plurality of non-woven ceramic fibers formed, for instance, in one embodiment, as described above in connection with FIGS. 5-6. Any desired number of fiber layers can be wrapped around the ceramic element to achieve a desired fiber layer thickness. The ceramic fibers can be formed of any number of materials, such as carbon, silicon carbide, silicon nitride, boron carbide, tungsten carbide, titanium diboride, etc. In practice, the ceramic fibers can be any of a long list of carbides, nitrides, or borides, and oxide-based compositions. Further, the fibers can be formed of glass material, such as high-temperature glass based on aluminosilicate compositions, such as barium strontium aluminosilicate, barium magnesium aluminosilicate, and barium aluminosilicate. Further, refractory metals such as zirconium or tungsten can be used, if desired.

By way of specific example, FIGS. 7A-7B depict, in one implementation, a silicon carbide fiber layer wrapped around a monolithic, silicon carbide tube, with the heating element being, in one embodiment, a tungsten wire wound into a uniformly-spaced coil over the fabric layer using, for instance, a threading lathe or other filament winding process. If desired, an additional silicon carbide fabric layer can be applied over the heating element, and held in place by an inactive or passive wrap (e.g., an additional coiled fiber or wire). The embodiment of FIGS. 7A & 7B is shown ready for depositing of matrix material into the fiber preform by an embedded wire chemical vapor deposition (EWCVD) process, where matrix material is deposited into the preform, during the heating of the fiber preform by the heating element, to facilitate formation of the ceramic matrix bonded to the ceramic element. Advantageously, with the assembly of FIGS. 7A-7B, matrix chemical vapor infiltration (CVI) or chemical vapor deposition (CVD) is conducted in an otherwise unheated chamber (such as an aluminum chamber) in which precursor gasses can be flown, and equipped with electrical feed-throughs for the heating element. During heating by the embedded heating element, heat is conducted or wicked by the fiber layer, giving the heated structure a uniform glow. The fact that EWCVD can be conducted in such a simple process chamber is very advantageous.

FIGS. 8A-8F illustrate further details of one implementation of fiber preform 700 (FIGS. 7A-7B) formation and embedded wire chemical vapor deposition (EWCVD) of a ceramic matrix, such as disclosed herein.

Figure 8A:
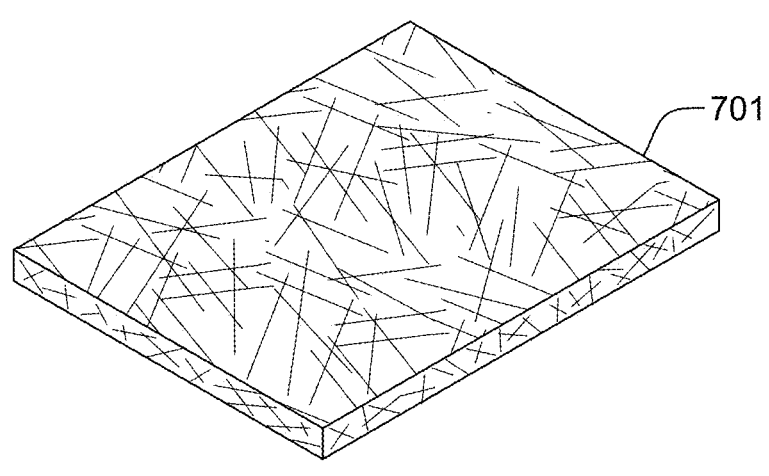
FIGS. 8A-8F illustrate one process embodiment of forming a fiber preform for embedded wire chemical vapor deposition (EWCVD) of a matrix material to a ceramic element to form a ceramic matrix composite (CMC) shell, in accordance with one or more aspects of the present invention.

Referring to FIG. 8A, fiber layer 701 is obtained or formed with a plurality of fibers, such as a plurality of ceramic fibers, either woven or unwoven, as discussed herein. In the example of FIGS. 7A-8F, the fiber layer is assumed to include a plurality of unwoven ceramic fibers, such as a plurality of unwoven LCVD-formed ceramic fibers. In one particular implementation, the fibers can be silicon carbide fibers. In one embodiment, the fibers can be formed of a uniform length, while in another embodiment, the fibers within the fiber layer can have different lengths. From a space-filling point of view, a distributed size population can advantageously fill the volume more efficiently than a uniform fiber population. In such an implementation, a distribution of fiber lengths can be obtained, for instance, via LCVD growth, with the laser printing process described herein being uniquely suited for this purpose while obtaining high-quality ceramic fibers. If desired, high-purity ceramic powder (e.g., high-purity SiC powder) can also be produced from the LCVD process, along with a grinding step. The costs of matrix formation can be further reduced by providing such ceramic powder within the fiber layer, intermixed with the fibers to fill more space with high-quality ceramic material for the matrix. This can also be used in the formation of composites by reactive sintering or FAST-sintering.

Figure 8B:
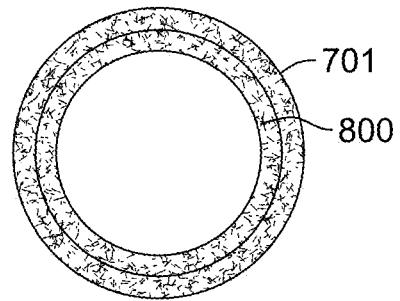

In FIG. 8B, by way of example, fiber layer 701 is shown wrapped around a ceramic element 800, such as a silicon carbide tube. Advantageously, the approach disclosed herein is a more cost-effective approach to producing a ceramic matrix composite over a ceramic tube, such as an existing silicon carbide (SiC) tube, while limiting thermal exposure of the substrate. Moreover, in one embodiment, the resulting material is an SiC/SiC composite, rather than a monolithic SiC. This means that the technique can be expanded to joining SiC and SiC/SiC composite elements, as discussed further herein.

Figure 8C:
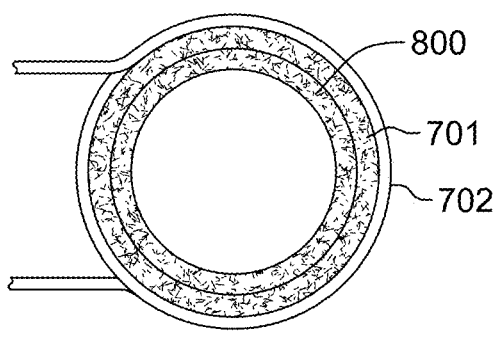

In FIG. 8C, a heating element 702, such as a resistive wire, has been wrapped around the assembly which, in part, holds in place fiber layer 701. As illustrated in FIGS. 7A-7B, heating element 702 can be wrapped tightly around the assembly, along a desired length of the assembly where the ceramic matrix is to form. In one or more embodiments, heating element 702 is in direct physical contact with fiber layer(s) 701 so that during embedded wire chemical vapor deposition, heat from the heating element is thermally conducted within the fiber preform by the fibers in contact with the heating element. This facilitates a more uniform distribution of heat within the preform during deposition of the matrix material.

Figure 8D:
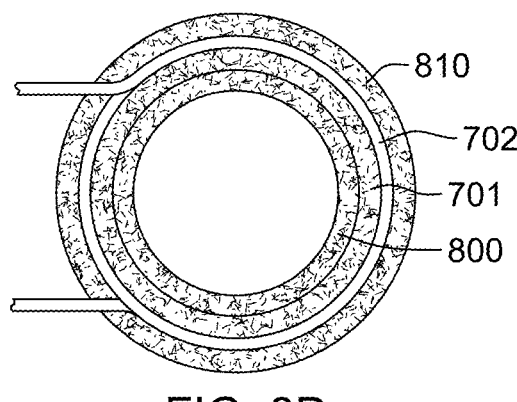
Figure 8E:
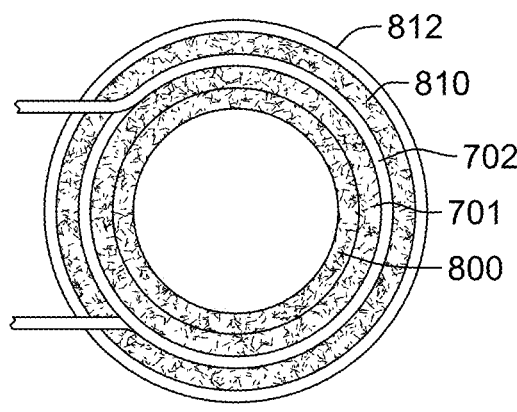

In FIG. 8D, an optional further fiber layer(s) 810 has been wrapped around the assembly, with heating element 702 positioned between fiber layer 701 and fiber layer 810. In FIG. 8E, an inactive or passive fiber or wire wrap 812, such as a structural wire, has been added, wrapping around the assembly over fiber layer 810 to hold fiber layer 810, and the rest of the assembly, in place during embedded wire chemical vapor deposition (EWCVD) of the matrix material.

Figure 8F:
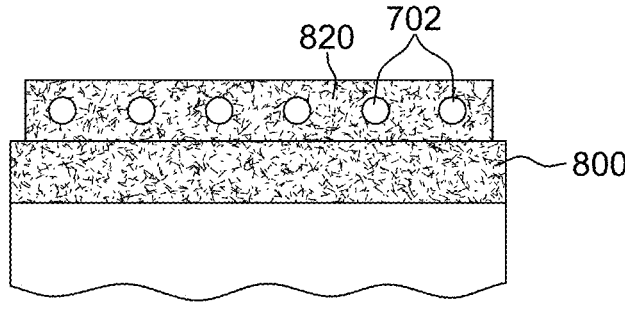

By way of example, FIG. 8F schematically illustrates a resultant EWCVD SiC/SiC ceramic matrix composite 820 bonded to ceramic element 800, such as a silicon carbide cladding tube for a nuclear power application. As illustrated in FIG. 8F, in one embodiment, residual wires of heating element 702 remain after formation of the ceramic matrix bonded to the ceramic element. As described below, in one or more embodiments, these residual wires can be removed from the final structure by, for instance, polishing or grinding the final structure down.

As noted, the fiber preforms and embedded wire chemical vapor deposition (EWCVD) processes disclosed herein can further be used in the homogeneous and heterogeneous joining of ceramic and ceramic matrix composite elements, such as shells. In this context, a shell is a structural element characterized by its geometry, being a three-dimensional solid whose thickness is small when compared to other dimensions. In one or more embodiments, the shell can be a cylindrical-shaped tube. A homogeneous joint refers to a joint that joins like material components with added like material, while a heterogeneous joint refers to a joint that joins different or like material components with a different material. A variety of joints can be formed using processes such as disclosed herein, including a lap-joint, where elements are joined edge-wise, with additional material(s) being added to join to each ceramic element separately through the element surface, a butt-joint, where ceramic elements are joined edge-wise, etc.

Advanced refractory ceramic materials, including ceramic matrix composite (CMC) materials, are highly valued for their high-temperature properties. The desirable properties that made advanced ceramics attractive, however, make designing and manufacturing them challenging. In one or more aspects, the embedded wire chemical vapor deposition (EWCVD) processes disclosed herein further facilitate permanently joining advanced ceramics together in a joining or bonding operation.

For instance, in one implementation, embedded wire chemical vapor deposition (EWCVD) processing as disclosed herein can be used to permanently join ceramic matrix composite cladding tubes for advanced nuclear fuels. Those skilled in the art will note, however, from the description provided herein, that the concepts disclosed are not limited to use with cladding tubes. Rather, the concepts presented are applicable to permanently joining a variety of different ceramic elements, including advanced ceramic shells, whether made of similar materials or not.

Nuclear fuel rods are the tubular protective cladding which separates the wrath of nuclear fuel pellets from the environment. The material from which this cladding is made should exhibit a nearly inexhaustive list of desirable attributes: unobtrusively thin to the point of having almost no volume and still exhibit hermiticity, containment of fission by-products, high thermal conductivity, chemical and thermal stability, and strong mechanical protection. Typically, this material has been zirconium-based alloys. Unfortunately, zirconium-based alloys are vulnerable to rapid steam oxidation, which leads to a hydrogen build-up when there is a loss of coolant to the fuel rods. For this reason, alternate materials that can exhibit the desired attributes are being investigated, including silicon carbide (SiC).

Silicon carbide (SiC) is a high-temperature ceramic that is mechanically stable over a range of temperatures, is resistant to oxidation, and exhibits low neutron absorption, and is a potential candidate for nuclear fuel cladding, either as a monolith, a silicon carbide fiber-reinforced silicon carbide matrix (SiC/SiC) composite, or a hybrid of metal and SiC/SiC composite. One difficulty with using SiC or SiC/SiC for cladding lies in the manufacturing process of hermetically sealing the ends of the fuel rods with SiC end plugs. A joining approach that strikes a balance between being economically feasible and less technically onerous is desired.

Figure 9:
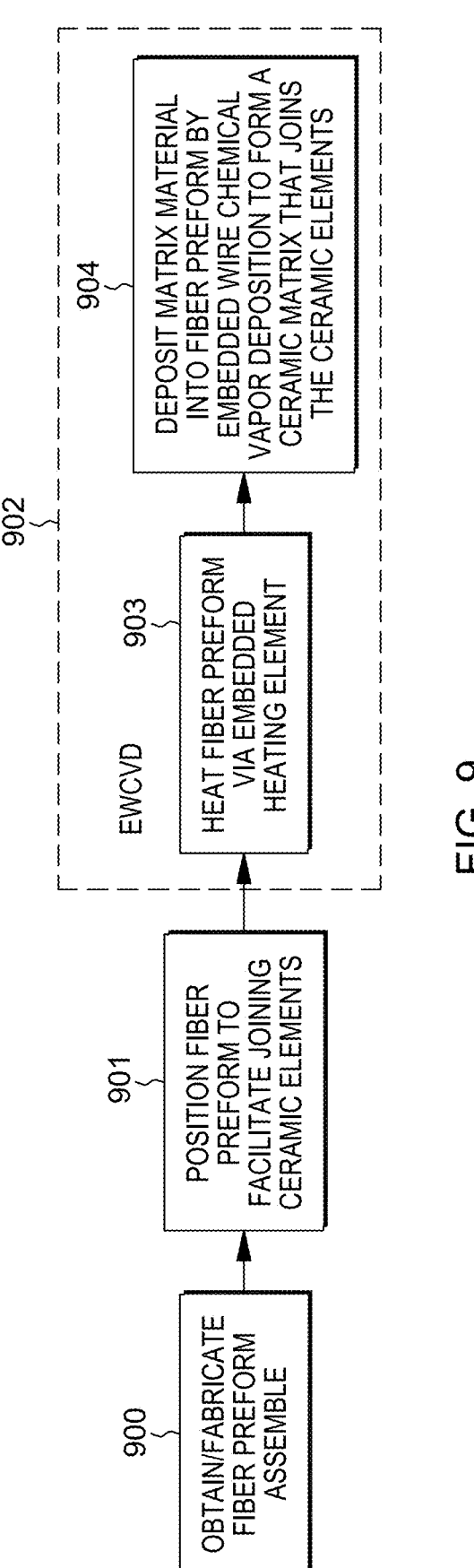
FIG. 9 depicts one embodiment of an embedded wire chemical vapor deposition (EWCVD) process for joining ceramic elements, in accordance with one or more aspects of the present invention.

FIG. 9 illustrates one embodiment of a process, in accordance with one or more aspects of the present invention, for joining ceramic elements, such as the above-noted elements or components of a fuel rod. As described herein, a fiber preform is obtained, (e.g., fabricated or assembled), to facilitate joining the ceramic elements 900. The fiber preform includes one or more fiber layers with a plurality of fibers, and a heating element embedded within the fiber preform, selected and configured to generate temperatures required for chemical vapor deposition (CVD) of the desired matrix material, for instance, temperatures in the range of 600° C.-2000° C. As explained herein, the plurality of fibers can be, or include, a plurality of non-woven fibers or a plurality of woven fibers as desired for a particular application. A plurality of non-woven fibers, such as the non-woven fibers described above, can advantageously address any issue of porosities (open and closed) that might be left with woven fibers, such as an SiC/SiC composite part made from woven fibers.

As illustrated in FIG. 9, embedded wire chemical vapor deposition (EWCVD) 902 can proceed once the fiber preform is positioned to facilitate joining the ceramic elements and placed, for instance, in a chamber configured to facilitate the embedded wire chemical vapor deposition (EWCVD) process; that is, a chamber to introduce the desired precursor gases and which provides or allows for electrical contacts to the heating element embedded within the preform. Embedded wire chemical vapor deposition (EWCVD) includes heating the fiber preform within the chamber via the embedded heating element 903 to deposit matrix material into the fiber preform from the precursor gases by chemical vapor deposition (CVD), and thereby form a ceramic matrix that (for instance) joins ceramic elements 904.

As noted, the fiber layer(s) used within the fiber preform can be formed of either non-woven fibers or woven fibers, with the particular implementation choice potentially being by way of manufacturer preference. Advantages of non-woven fiber formats such as described above in connection with FIGS. 5-8F include being easier and less costly to produce (that is, the wet-laid processing versus equivalent high-tech weaving), and ease of access for the matrix to fill in the porosities (open porosities compared to pockets of closed-off, potentially inaccessible porosities in fiber weaves). In one or more implementations, the non-woven fiber layers are in the range of 300-600 grams per square meter density of fiber loading to achieve the type of mechanical performance desired in the composite structure.

In exemplary implementations depicted in FIGS. 10A-10G & FIGS. 12A-12I, the fiber layers are illustrated as woven fiber layers, by way of example only. Note that the processes illustrated in these figures can alternately be employed with non-woven fiber layers as well.

Figure 10A:
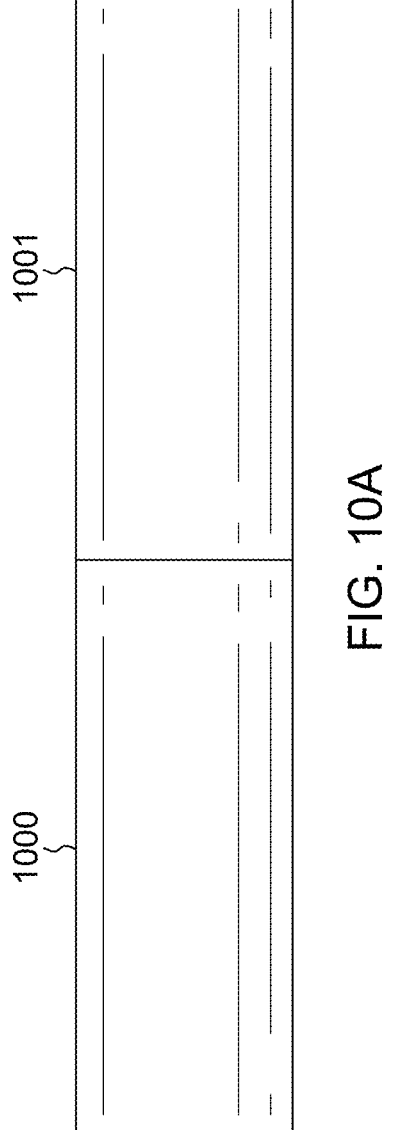
FIGS. 10A-10G illustrate one embodiment of a process of forming a joint between ceramic elements by embedded wire chemical vapor deposition (EWCVD) of a ceramic matrix, in accordance with one or more aspects of the present invention.
Figure 10B:
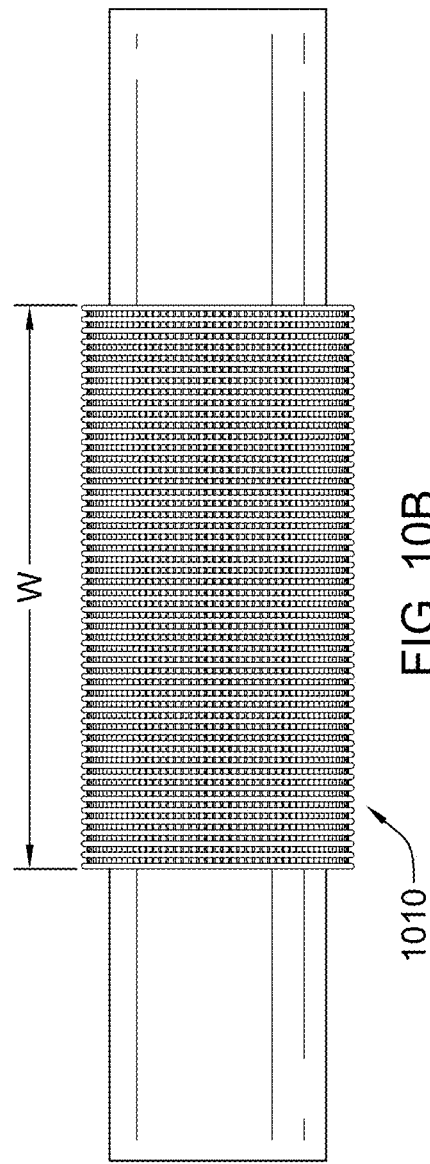

FIGS. 10A-10G illustrate one embodiment of a process of forming a joint between ceramic elements by embedded wire chemical vapor deposition (EWCVD) of a ceramic matrix, in accordance with one or more aspects of the present invention. These figures illustrate one example of formation of a lap-joint across two ceramic elements 1000, 1001, for instance, two ceramic tubular elements, positioned with minimal or no gap between the elements, as illustrated in FIG. 10A. In FIG. 10B, one or more fiber layers 1010, such as described herein, are wrapped around the region where the ceramic elements 1000, 1001 meet. In one embodiment, the width W of ceramic layer 1010 can be any desired width, with the width illustrated in the figures being approximately twice the diameter of the ceramic elements 1000, 1001. In one implementation, the thickness of fiber layer 1010 can be in the range of 200 microns to 1 millimeter, and depending on the production process, multiple fiber layers can be stacked to achieve the desired fiber layer thickness. For instance, in one implementation, two or three fiber layers can be wrapped around the region where the ceramic matrix is to be formed. Note again that fiber layer 1010 is shown in the figure as a woven fiber layer, by way of example only.

Figure 10C:
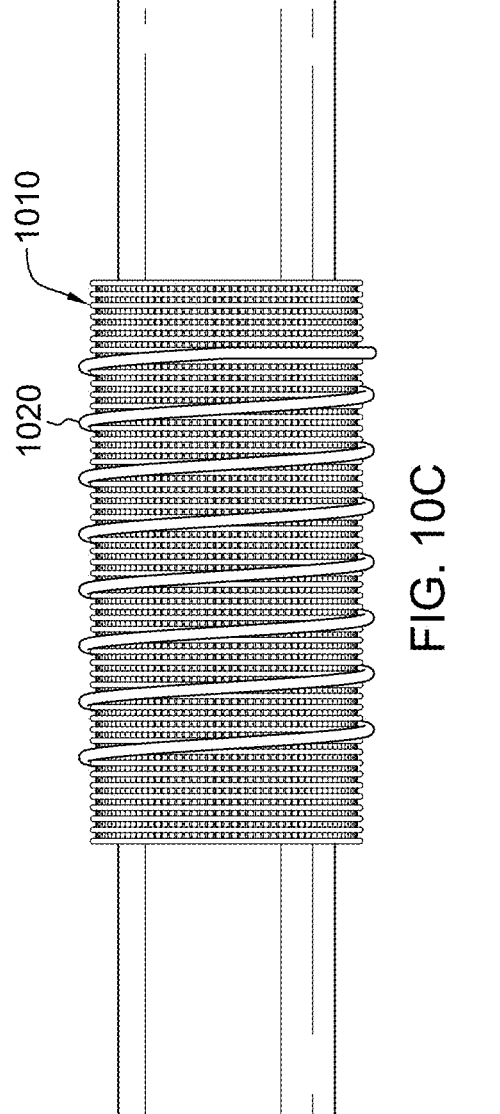

In FIG. 10C, a heating element 1020, such as a resistive fiber or wire as described herein, has been wound around fiber layer 1010. In one or more implementations, heating element 1020 can be a resistive wire with winding spaced, for instance, with a pitch of approximately 0.5-3 mm (such as 1 mm, for a tungsten wire implementation). In one or more embodiments, heating element 1020 is a uniformly-spaced coil wound over, around and in contact with fiber layer 1010 using, for instance, a filament winding process. Connecting leads (see FIG. 10F) extend from heating element 1020 to allow powering of the element within a chamber to generate the heat within the preform needed for deposition of the matrix material. In one or more embodiments, the heating element is made of a material selected and sized to facilitate generating the desired deposition temperature, for instance, in the range of 600° C.-2000° C. By way of example, in one or more embodiments, heating element 1020 can be a resistive wire, such as a tungsten wire, or a carbon fiber, or other resistive material. In operation, generated heat is thermally conducted away from the heating element along the fibers in contact with the heating element to facilitate chemical vapor deposition (CVD) at a high rate compared with prior deposition approaches. For instance, using the embedded wire chemical vapor deposition (EWCVD) processes disclosed herein, matrix material is deposited at rates that are orders of magnitude faster than traditional CVD approaches using a furnace. Further, the thermal gradient is very hot within the preform in operation, causing (in one or more embodiments) the preform to glow red during the deposition process.

Figure 10D:
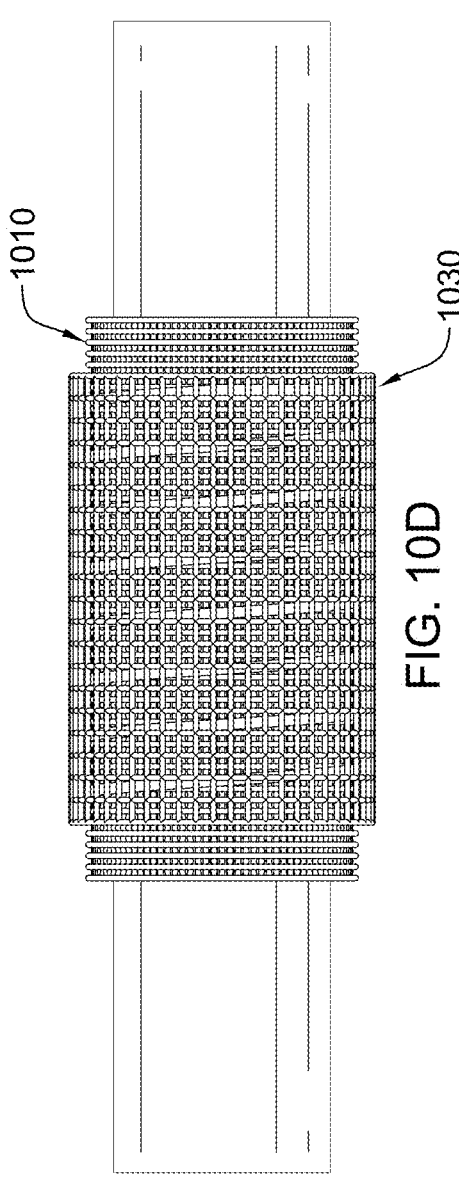

In FIG. 10D, another fiber layer 1030 (such as disclosed herein) is optionally added over fiber layer 1010 and heating element 1020, as well as an inactive or passive fiber or wire wrap (not shown) wrapping around the assembly illustrated in FIG. 10D to hold fiber layer 1030, and the rest of the assembly, in place during embedded wire chemical vapor deposition (EWCVD) of the matrix material. As noted, this outer inactive fiber or wire wrap is structural in nature in one or more implementations.

Figure 10E:
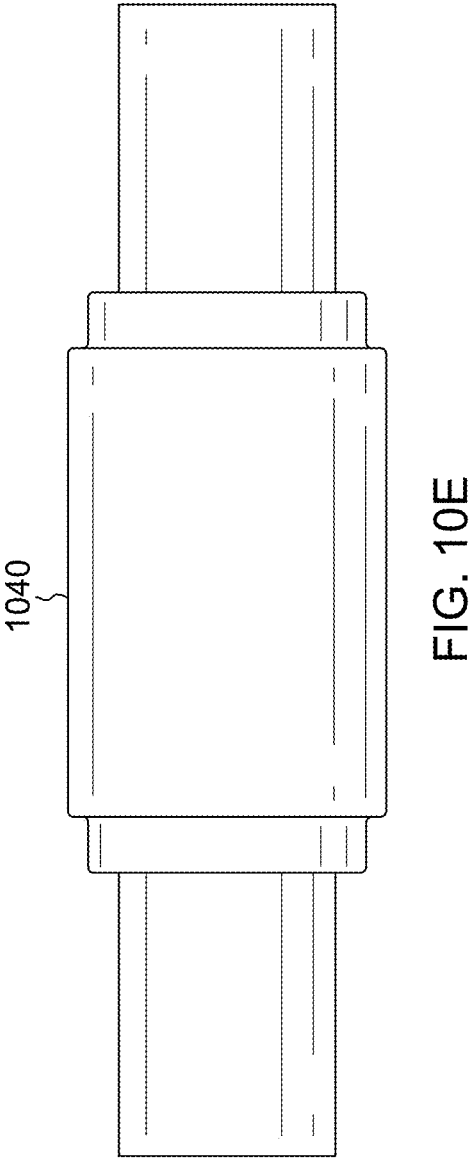

FIG. 10E illustrates one embodiment of the resultant ceramic matrix joint formed after deposition of the matrix material in the fiber preform using embedded wire chemical vapor deposition (EWCVD). In one or more implementations, the EWCVD process can be run within a chamber with a CVD precursor to deposit an interphase layer on the fibers first, and then the desired ceramic matrix, such as SiC. The interphase layer serves to achieve fracture toughened behavior in the composite by providing a preferred pathway for crack propagation that expends fracture energy. The interphase layer generally has a layered crystallographic quality, with the crack path following the weaker inter-layer direction and thus creating longer effective distances for the crack to travel. A composite that behaves with improved fracture toughened performance in comparison to a monolithic ceramic material will dissipate significantly more fracture energy through crack propagation. A monolithic ceramic material acts as a brittle material with less fracture energy dissipated because of the fast, direct crack propagation path through the body of the monolith. Example interphase layers that can be used include pyrolytic carbon and boron nitride, both of which have a layered crystallographic structure. By way of example, FIG. 14A is an optical microphotograph of a non-woven fiber layer coated with an interphase material, such as pyrolytic carbon. FIG. 14B is a scanning electron microscope image of a composite polished cross-section on the left side, and a magnified area on the right side, showing sample silicon carbide fibers with pyrolytic carbon interphase coating remaining in a resultant ceramic matrix.

Figure 10F:
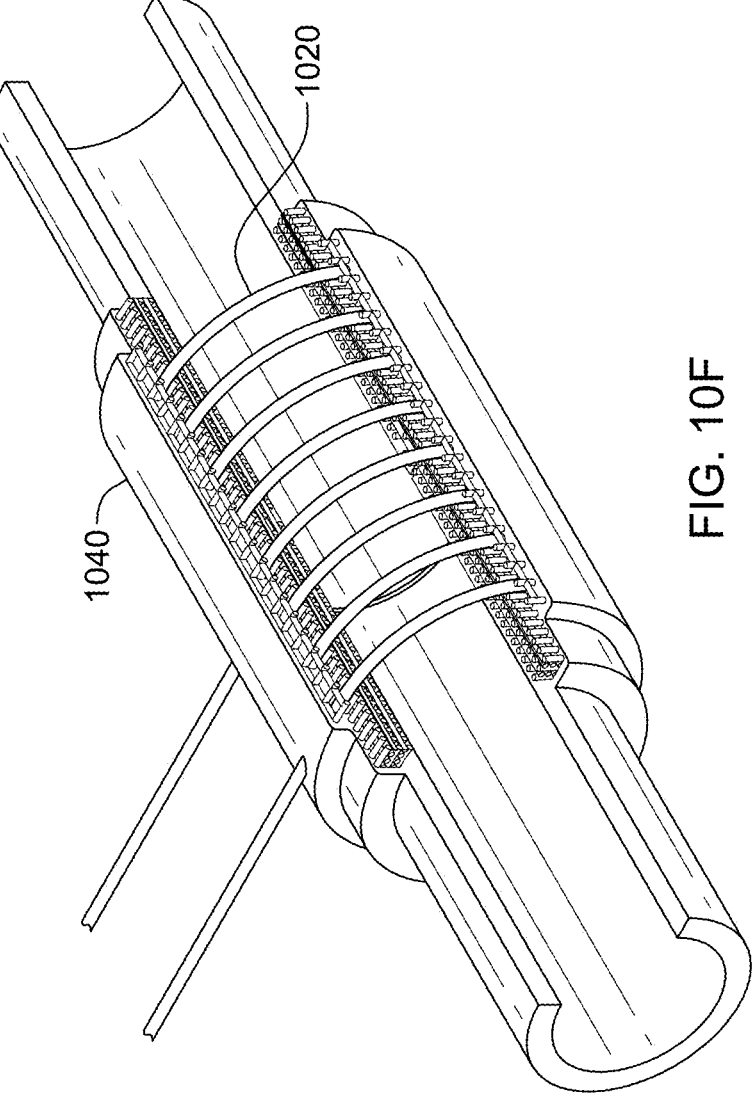
Figure 10G:
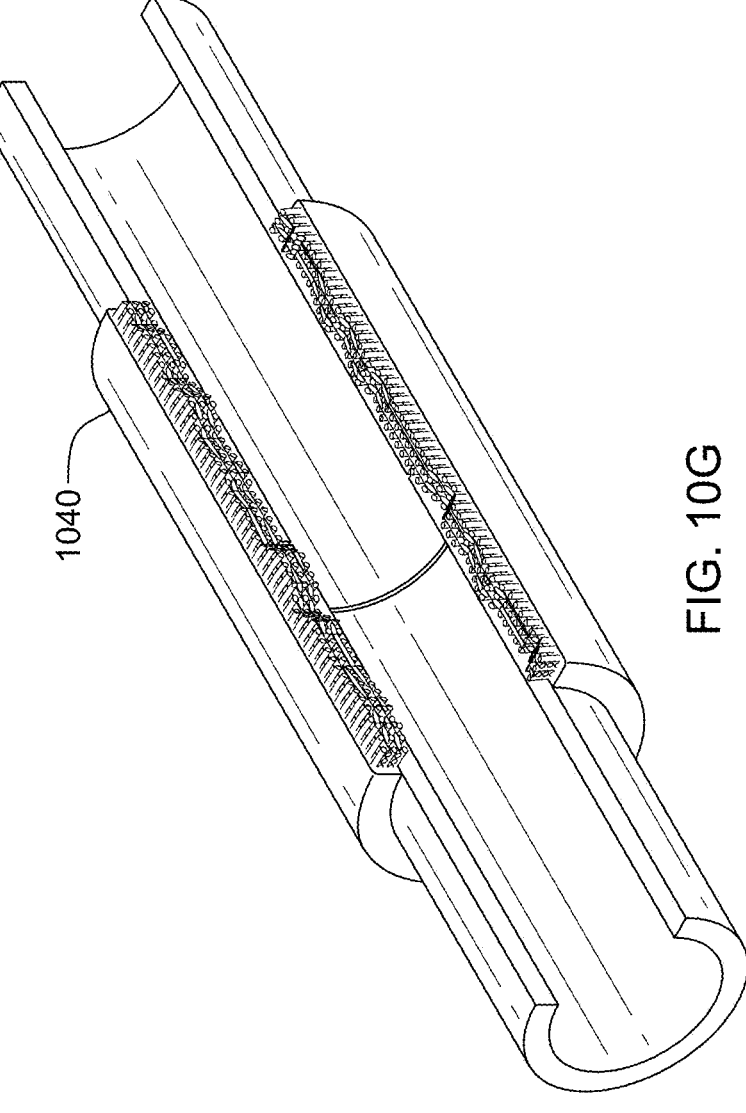

FIG. 10F is a partial cut-away view of the resultant joint 1040 of FIG. 10E, with the heating element 1020 shown in position, and the joint and ceramic elements partially cut away. Note that the electrical contacts for heating element 1020 can be brought from the assembly in any desired location to facilitate powering the heating element. FIG. 10G illustrates the structure of FIG. 10F after an optional grinding process has occurred, in order to lower the profile of the ceramic matrix composite joint 1040 and reduce or eliminate the presence of the heating element within the joint. Depending upon the use of the assembly, this optional grinding step may be advantageous, for instance, to the flow of a gas or fluid across the outer surface.

Figure 11:
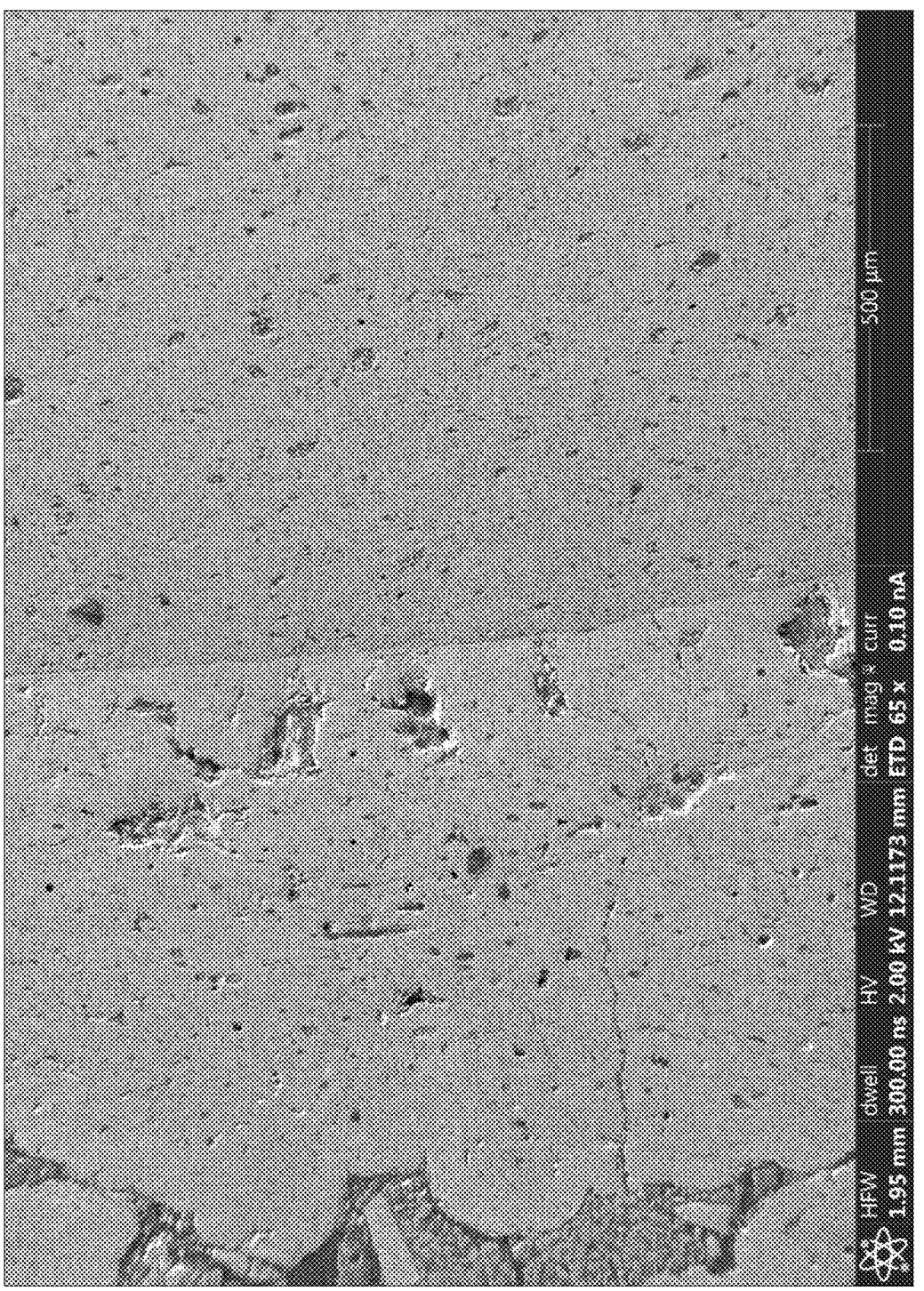
FIG. 11 is a partial scanning electron microscope (SEM) image of a ceramic matrix formation on a ceramic element, in accordance with one or more aspects of the present invention.

By way of example, FIG. 11 depicts a partial scanning electron microscope (SEM) image of a ceramic matrix 1100 formed on a ceramic element 1101 using embedded wire chemical vapor deposition (EWCVD) processes, such as disclosed herein. Note that the size of pores are similar for the matrix material 1100 and the underlying monolithic ceramic element 1101. Elemental analysis show that the composition is within the margin of error for stoichiometry. Further, the fibers remain apparent in a back-scatter image (not shown) and appear undamaged by the EWCVD process.

FIGS. 12A-12I illustrate another embodiment of a process of forming a joint between ceramic elements by embedded wire chemical vapor deposition (EWCVD) of a ceramic matrix, in accordance with one or more aspects of the present invention. These figures illustrate one example of formation of a butt-joint to join two ceramic elements 1201, 1202 (FIG. 12B), such as two ceramic tubular elements.

Figures 12A, 12B:
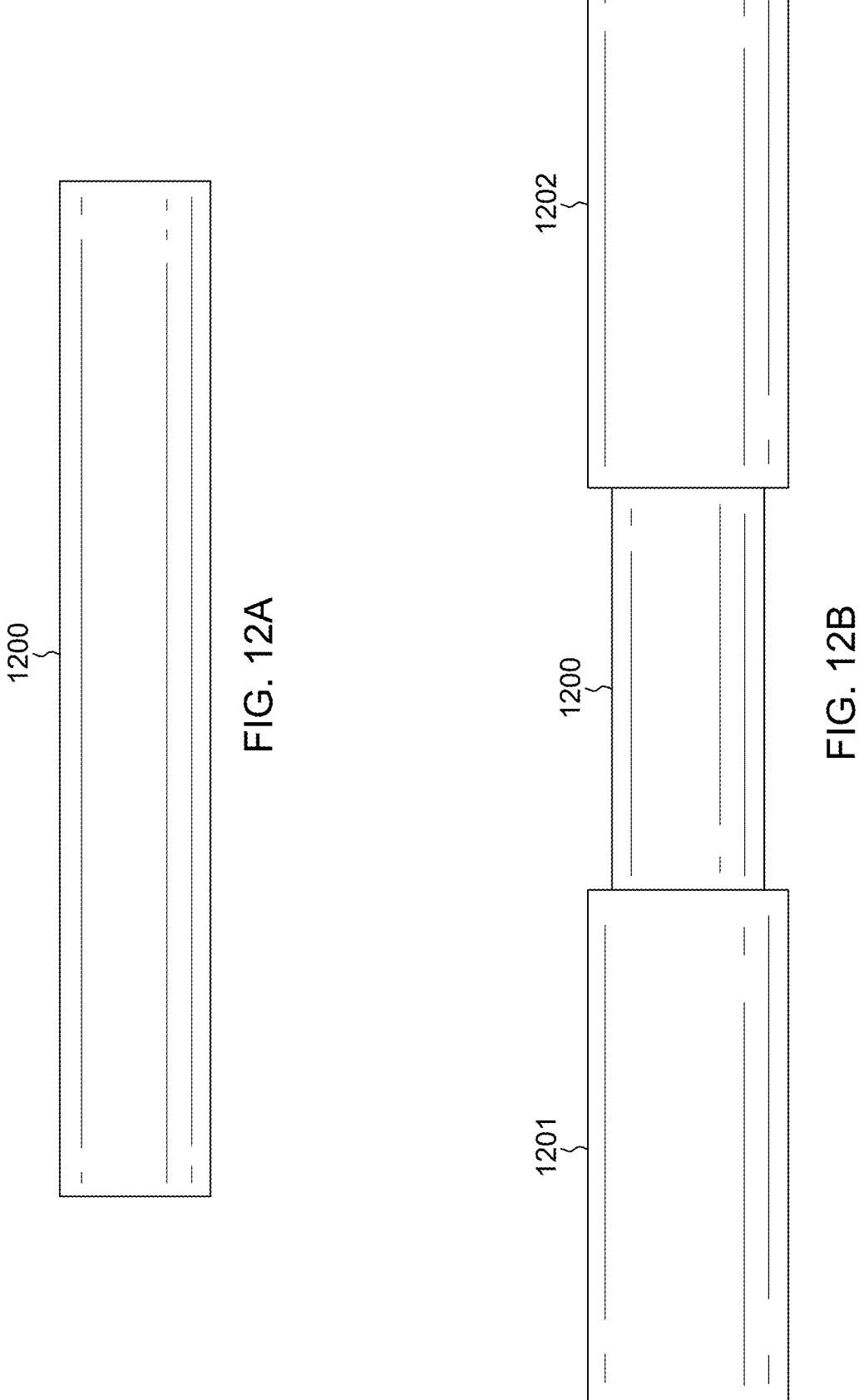
FIGS. 12A-12I illustrate another embodiment of a process of forming a joint between ceramic elements using embedded wire chemical vapor deposition (EWCVD) of a ceramic matrix, in accordance with one or more aspects of the present invention.

As illustrated in FIG. 12A, the process includes obtaining a mandrel or sleeve 1200, around which the fiber preform is to be assembled. In one embodiment, mandrel 1200 is an expendable carbon mandrel, such as a graphite mandrel that is burned away once the joint is complete. In another embodiment, mandrel 1200 can be a ceramic sleeve, such as a silicon carbide sleeve, which may be sealed and remains part of the resultant assembly.

In FIG. 12B, the ceramic elements 1201, 1202 to be joined are inserted on either side of mandrel 1200. Note in this regard that mandrel 1200 has a diameter sized to extend at least partially into the respective ceramic elements 1201, 1202 being joined. In this embodiment, the ceramic elements remain spaced apart a desired distance, which can vary. For instance, in one or more embodiments, the width of the mandrel exposure between ceramic elements can be approximately half the diameter of the ceramic openings, with the shorter width advantageously minimizing stress on the resultant joint. In the example of FIG. 12B, it is assumed that the axis of mandrel 1200 aligns with the axis of the ceramic elements 1201, 1202, which as noted are two ceramic tubular elements, in one example.

Figures 12C, 12D:
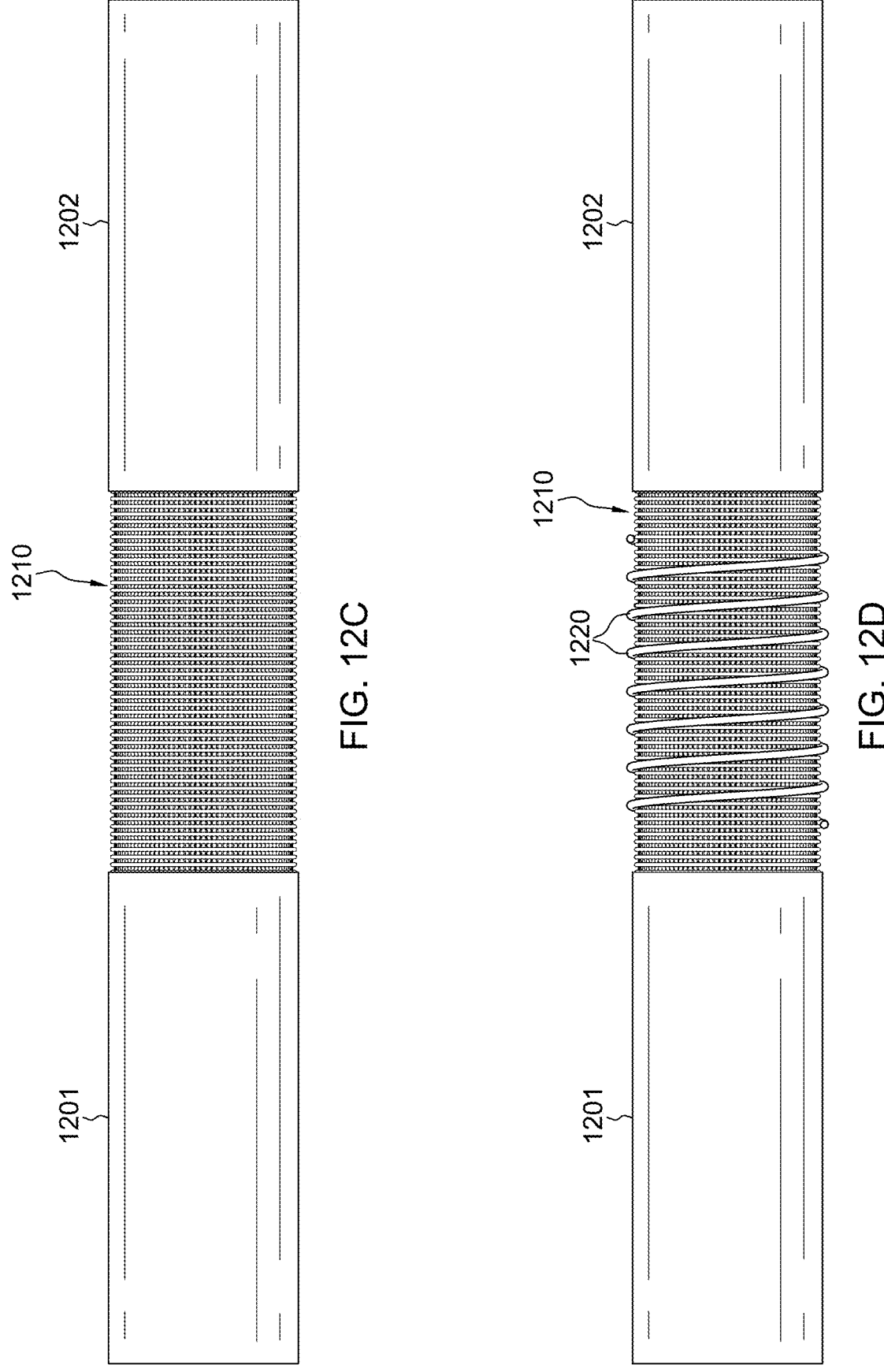

In FIG. 12C, a fiber layer 1210, such as described herein, is wrapped around the exposed mandrel. In one implementation, the thickness of fiber layer 1210 can be in the range of 200 microns to 1 millimeter, and depending on the production process, multiple fiber layers can be wrapped around the mandrel to achieve the desired fiber layer thickness. For instance, in one implementation, two or three fiber layers can be wrapped around the region where the ceramic matrix is to be formed. In one implementation, fiber layer 1210 can have a thickness approximating the thickness of the wall of the ceramic tubular elements. Note again that fiber layer 1210 is shown in the figures as a woven fiber layer, by way of example only.

In FIG. 12D, a heating element 1220, such as a resistive fiber or wire heating element described herein, has been wound around fiber layer 1210. In one or more implementations, heating element 1220 can be a resistive wire with winding spaced, for instance, with a pitch of approximately 0.5-3 mm (such as 1 mm, for a tungsten wire implementation). In one or more embodiments, heating element 1220 is a uniformly spaced coil wound over, around and in contact with fiber layer 1210 using, for instance, a filament-winding process. Connecting leads (see FIG. 12G) extend from heating element 1220 to allow powering of the element within the chamber to generate the heat within the preform needed for deposition of the matrix material. In one or more embodiments, the heating element is made of a material selected and sized to facilitate generating the desired deposition temperature, for instance, in the range of 600° C.-2000° C. In one or more embodiments, heating element 1220 can be a resistive wire, such as a tungsten wire, or a carbon fiber, or other resistive material. In operation, generated heat is thermally conducted away from the heating element by the fibers in contact with the heating element to facilitate chemical vapor deposition (CVD) within the preform at a high rate compared with prior approaches.

Figures 12E, 12F:
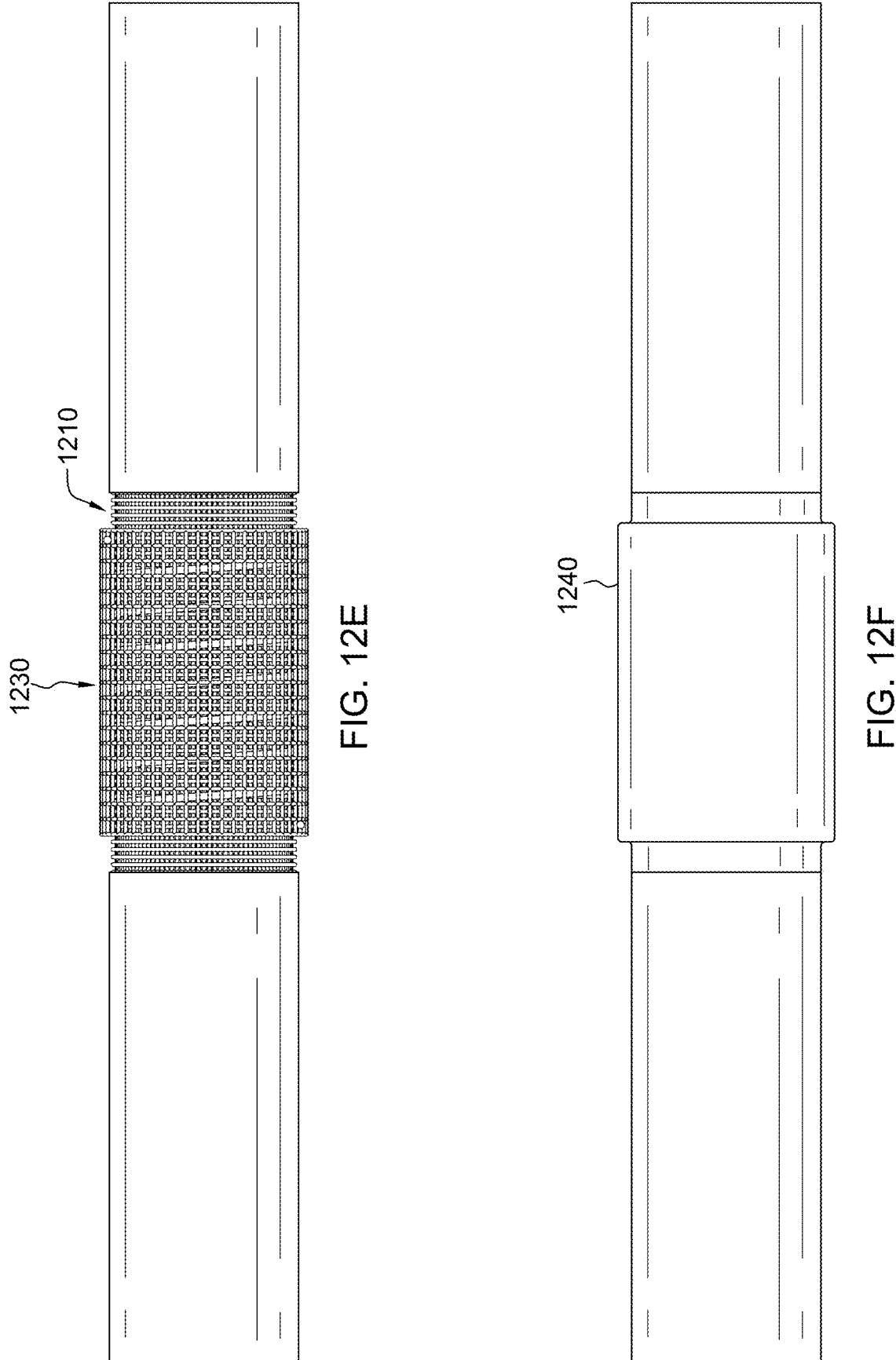

In FIG. 12E, another fiber layer 1230 (such as described herein) is optionally added over fiber layer 1210 and heating element 1220, as well as an inactive or passive fiber or wire wrap (not shown) wrapping around the assembly illustrated in FIG. 12E, to hold the fiber layer 1230, and the rest of the assembly, in place during embedded wire chemical vapor deposition (EWCVD) of the matrix material. As noted, this outer inactive fiber or wire wrap is structural in nature in one or more implementations.

FIG. 12F illustrates one embodiment of the resultant ceramic matrix joint 1240 formed after deposition of the matrix material in the fiber preform using embedded wire chemical vapor deposition (EWCVD). In one or more implementations, the EWCVD process is run within a chamber with a CVD precursor to deposit an interface layer on the fibers first, and then the desired ceramic matrix, such as silicon carbide in one embodiment.

Figure 12G:
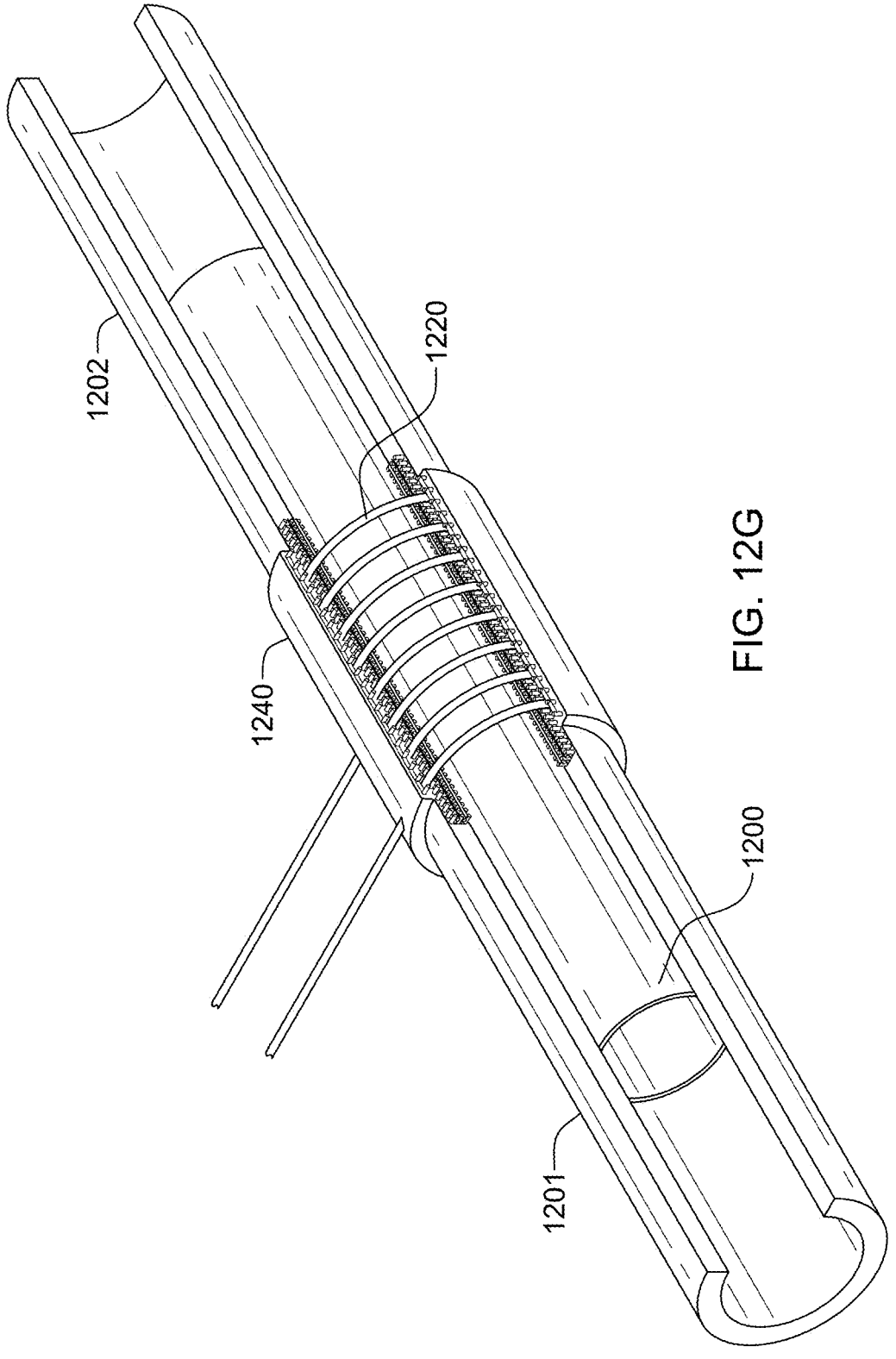
Figure 12H:
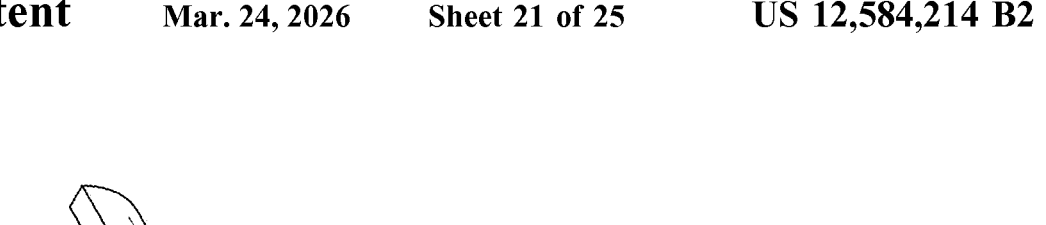
Figure 12I:
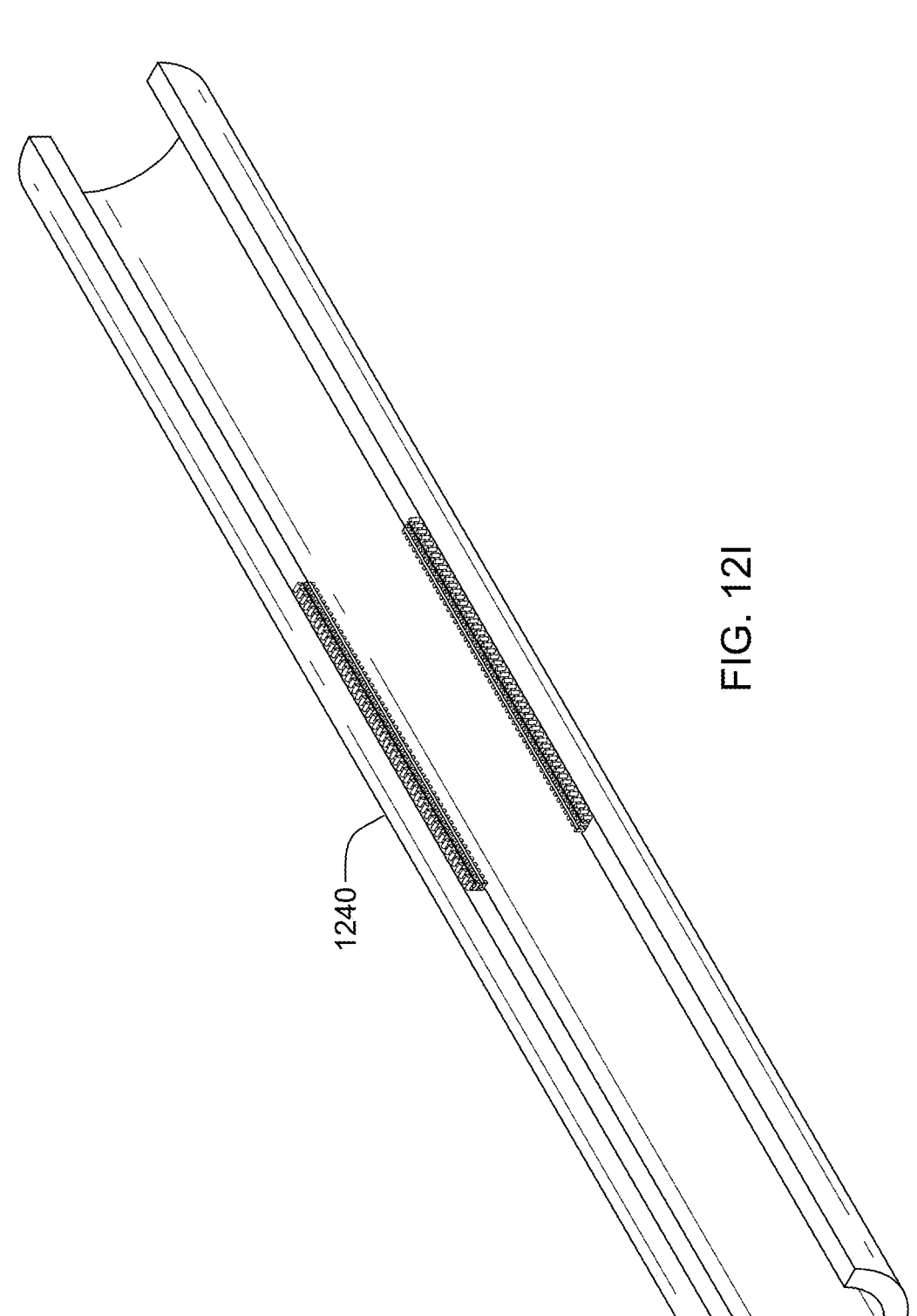

FIG. 12G is a partial cutaway view of the resultant joint of 1240 FIG. 12F, with the heating element 1220 shown in position, and the joint and ceramic elements partially cut away. Note that the electrical contacts for heating element 1220 can be brought from the assembly in any desired location to facilitate powering the heating element. FIG. 12H illustrates the structure of FIG. 12G, after an optional grinding process has occurred, in order to lower the profile of the ceramic matrix composite joint and reduce or eliminate the presence of the heating element within the joint. In FIG. 12I, mandrel 1200 has been removed, such as by being burned out in the case of an expendable carbon-based mandrel. For instance, in the case of a carbon mandrel, the mandrel can be burned out in air, such as by directing a flame into the center of the joined structure.

Figure 13A:
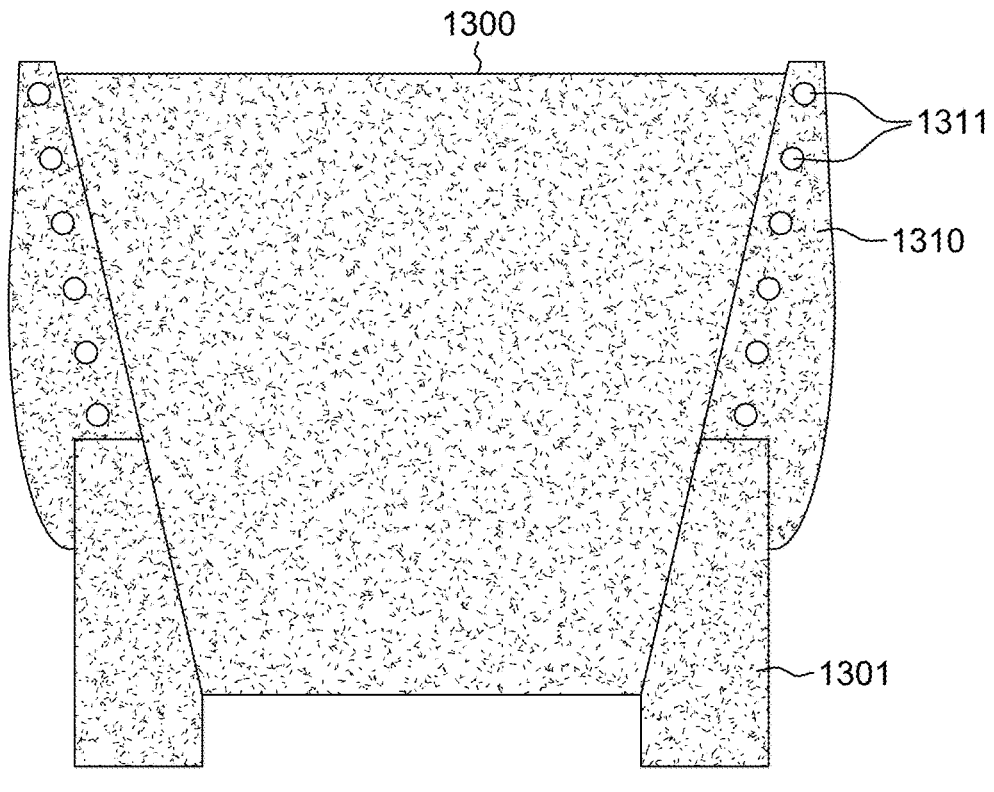
FIGS. 13A & 13B depict alternate embodiments of ceramic elements joined using embedded wire chemical vapor deposition (EWCVD) of a ceramic matrix, in accordance with one or more aspects of the present invention.
Figure 13B:
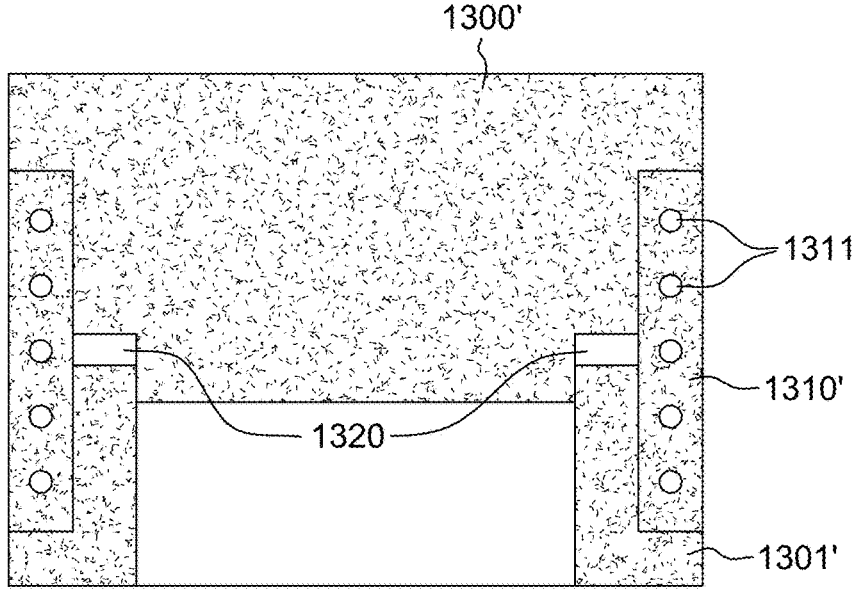

FIGS. 13A & 13B depict further examples of ceramic matrices formed using embedded wire chemical vapor deposition (EWCVD) processing, such as described herein.

In FIG. 13A, a conical-shaped ceramic plug 1300, such as a conical silicon carbide plug, is shown joined to a ceramic matrix composite cladding tube 1301, such as embodied by a silicon carbide fiber-reinforced silicon carbide matrix ceramic matrix composite tube ($SiC_f$—SiC—$_m$CMC). An embedded wire chemical vapor deposition (EWCVD) joint 1310 is shown overlapping, in part, the interface between conical-shaped ceramic plug 1300 and ceramic matrix composite tube 1301. In one or more implementations, the ceramic matrix formed can be a SiC/SiC ceramic matrix composite joint 1310 with residual heating element 1311 shown as part of the joint. In one or more embodiments, the residual heating element can be a residual tungsten, molybdenum or carbon wire, such as described herein.

In FIG. 13B, a cylindrical-shaped ceramic plug 1300' is shown joined to a ceramic tube 1301' via a ceramic matrix joint 1310' formed by embedded wire chemical vapor deposition (EWCVD), such as described herein. In one or more implementations, ceramic plug 1300' is a cylindrical-shaped plug, such as a silicon carbide plug, and ceramic element 1301' is a ceramic matrix composite tube, such as an $SiC_f$—SiC$_m$CMC tube. In this configuration, an optional gasket 1320, such as an optional Ta compression gasket, is disposed between the ceramic elements 1300', 1301'. Further, in the embodiment illustrated, the ceramic joint 1310' is shown formed, by way of example, such as described above in connection with FIGS. 12A-12I. The ceramic joint is (in one embodiment) an SiC/SiC ceramic matrix composite joint.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of forming a ceramic matrix, the method comprising:

obtaining a fiber preform to facilitate forming the ceramic matrix, the fiber preform comprising a fiber layer with a plurality of fibers and a heating element in contact with and wrapping around the fiber layer, the heating element being embedded within the fiber preform and wrapping around the fiber layer in direct contact with fibers of the plurality of fibers of the fiber layer;

heating the fiber preform via the heating element embedded within the fiber preform; and depositing matrix material into the fiber preform by embedded wire chemical vapor deposition (EWCVD) of the matrix material during the heating of the fiber preform by the heating element embedded therein, the chemical vapor deposition of the matrix material within the fiber preform facilitating formation of the ceramic matrix.

2. The method of claim 1, wherein the plurality of fibers of the fiber layer comprise a plurality of non-woven ceramic fibers dispersed throughout the fiber layer, the plurality of non-woven ceramic fibers conducting heat, at least in part, from the heating element during heating of the fiber preform.

3. The method of claim 1, wherein the plurality of fibers of the fiber layer comprise a plurality of woven ceramic fibers within the fiber layer, the plurality of woven ceramic fibers conducting heat, at least in part, from the heating element during heating of the fiber preform.

4. The method of claim 1, wherein the ceramic matrix formed during the depositing of the matrix material comprises a ceramic matrix composite shell.

5. The method of claim 1, wherein the ceramic matrix formed during the depositing of the matrix material comprises a ceramic matrix composite shell with a closed surface envelope.

6. The method of claim 1, wherein the heating element comprises a resistive element, the resistive element comprising an ordinarily solid material selected from a group consisting of boron, carbon, silicon, aluminum, phosphorus, gallium, germanium, arsenic, titanium, zirconium, niobium, molybdenum, hafnium, tantalum, tungsten, rhenium, osmium, nitrogen, and combinations thereof.

7. The method of claim 1, wherein the fiber layer with the plurality of fibers of the fiber preform is a first fiber layer with a first plurality of fibers, and wherein obtaining the fiber preform comprises obtaining the fiber preform with a second fiber layer with a second plurality of fibers, the second fiber layer wrapping over the heating element and the first fiber layer, with the heating element embedded between the first fiber layer and the second fiber layer, and with the heating element wrapping around the first fiber layer in direct contact with fibers of the first plurality of fibers, and the second fiber layer wrapping over the heating element and the first fiber layer with fibers of the second plurality of fibers in direct contact with the heating element to facilitate, during the depositing of the matrix material, formation of the ceramic matrix.

8. The method of claim 7, wherein the first plurality of fibers of the first fiber layer comprises a first plurality of non-woven ceramic fibers, and the second plurality of fibers of the second fiber layer comprises a second plurality of non-woven ceramic fibers.

9. The method of claim 1, further comprising positioning, prior to the heating and the depositing, the fiber preform to facilitate joining ceramic elements via the ceramic matrix.

10. The method of claim 9, wherein the ceramic elements are formed of the same monolithic material(s).

11. The method of claim 9, wherein the ceramic elements are formed of dissimilar monolithic material(s).

12. The method of claim 9, wherein the ceramic elements are formed of the same ceramic matrix composite.

13. The method of claim 9, wherein the ceramic elements are formed of dissimilar ceramic matrix composites.

14. A method of forming a fiber preform for facilitating formation of a ceramic matrix, the method comprising:

forming a fiber layer with a plurality of fibers to facilitate forming the ceramic matrix; and wrapping a heating element around and in contact with the fiber layer to form the fiber preform, wherein the heating element wrapping around the fiber layer is in direct contact with fibers of the plurality of fibers of the fiber layer and facilitates heating of the fiber preform for depositing of a matrix material within the fiber layer via embedded wire chemical vapor deposition (EWCVD) to facilitate formation of the ceramic matrix without use of a separately heated CVD furnace chamber.

15. The method of claim 14, wherein forming the fiber layer with the plurality of fibers comprises forming the fiber layer with a plurality of non-woven ceramic fibers dispersed throughout the fiber layer, the plurality of non-woven ceramic fibers conducting heat, at least in part, from the heating element during heating of the fiber preform.

16. The method of claim 14, wherein forming the fiber layer with the plurality of fibers comprises forming the fiber layer with a plurality of woven ceramic fibers, the plurality of woven ceramic fibers conducting heat, at least in part, from the heating element during heating of the fiber preform.

17. The method of claim 14, wherein forming the fiber layer comprises forming a first fiber layer with a first plurality of fibers, and wherein the method further comprises forming a second fiber layer with a second plurality of fibers wrapping over the heating element and the first fiber layer, with the heating element embedded between the first fiber layer and the second fiber layer, the heating element wrapping around the first fiber layer in direct contact with fibers of the first plurality of fibers, and the second fiber layer wrapping over the heating element and the first fiber layer with fibers of the second plurality of fibers in direct contact with the heating element to facilitate, during depositing of the matrix material, formation of the ceramic matrix.

18. The method of claim 17, wherein the first plurality of fibers comprises a first plurality of non-woven ceramic fibers, and the second plurality of fibers comprises a second plurality of non-woven ceramic fibers.

* * * * *